United States Patent
Noda

(10) Patent No.: US 10,103,168 B2
(45) Date of Patent: *Oct. 16, 2018

(54) STACKED TYPE SEMICONDUCTOR MEMORY DEVICE

(71) Applicant: TOSHIBA MEMORY CORPORATION, Minato-ku (JP)

(72) Inventor: Kotaro Noda, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/629,193

(22) Filed: Jun. 21, 2017

(65) Prior Publication Data

US 2017/0287931 A1   Oct. 5, 2017

Related U.S. Application Data

(63) Continuation of application No. 14/645,672, filed on Mar. 12, 2015, now Pat. No. 9,716,103.

(Continued)

(51) Int. Cl.
*H01L 29/66* (2006.01)
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ........... H01L 27/11582; H01L 29/7926; H01L 27/11578; H01L 29/66833; H01L 29/792;

(Continued)

(56) References Cited

U.S. PATENT DOCUMENTS 7,582,528 B2 * 9/2009 Kim ............... H01L 21/31116
257/E21.179
2008/0248646 A1 * 10/2008 Kim ............... H01L 21/31116
438/675

(Continued)

FOREIGN PATENT DOCUMENTS

JP      2010-199136      9/2010

*Primary Examiner* — Thao X Le
*Assistant Examiner* — Nduka Ojeh
(74) *Attorney, Agent, or Firm* — Oblon, McClelland, Maier & Neustadt, L.L.P.

(57) ABSTRACT

According to one embodiment, a semiconductor memory device includes a stacked body which is provided on a substrate and in which an insulating film and an electrode film are alternately stacked. The semiconductor memory device also includes an insulating member which penetrates the stacked body in a stacking direction of the insulating film and the electrode film to thereby separate the stacked body. The semiconductor memory device also includes a semiconductor pillar which penetrates the stacked body in the stacking direction. A maximum portion of the insulating member where a first distance from a side surface of the insulating member to a central plane of the insulating member becomes maximum and a maximum portion of the semiconductor pillar where a second distance from a side surface of the semiconductor pillar to a center line of the semiconductor pillar becomes maximum being provided in different positions in the stacking direction.

7 Claims, 25 Drawing Sheets

Related U.S. Application Data

(60) Provisional application No. 62/047,835, filed on Sep. 9, 2014.

(58) Field of Classification Search
CPC ......... H01L 21/28282; H01L 27/11556; H01L 27/11568; H01L 29/7813; H01L 21/77; H01L 21/8229; H01L 29/7802; H01L 29/7827
USPC ............ 257/E29.309, 324, E21.21, E21.679, 257/E27.103, E21.423, 329; 438/268, 438/386, 589, 591; 365/185.17, 185.22, 365/185.18, 185.28
See application file for complete search history.

(56) References Cited

U.S. PATENT DOCUMENTS

| | | | | |
|---|---|---|---|---|
| 2009/0283819 A1* | 11/2009 | Ishikawa | ........... | H01L 21/28282 257/324 |
| 2010/0019310 A1* | 1/2010 | Sakamoto | ......... | H01L 27/11578 257/324 |
| 2011/0031547 A1* | 2/2011 | Watanabe | ......... | H01L 27/11582 257/319 |
| 2012/0043599 A1* | 2/2012 | Katsumata | .......... | H01L 27/1157 257/314 |
| 2012/0241842 A1* | 9/2012 | Matsuda | ........... | H01L 21/28282 257/324 |
| 2013/0234235 A1* | 9/2013 | Matsuda | ........... | H01L 29/66833 257/324 |
| 2014/0146609 A1* | 5/2014 | Avila | .................... | G06F 11/106 365/185.17 |
| 2015/0070998 A1* | 3/2015 | Dong | ..................... | G11C 16/26 365/185.17 |

\* cited by examiner

STACKED TYPE SEMICONDUCTOR MEMORY DEVICE

CROSS-REFERENCE TO RELATED APPLICATIONS

This application is a Continuation of U.S. application Ser. No. 14/645,672 filed Mar. 12, 2015, which is based upon and claims the benefit of priority from U.S. Provisional Patent Application 62/047,835, filed on Sep. 9, 2014; the entire contents of each of which are incorporated herein by reference.

FIELD

Embodiments described herein relate generally to a semiconductor memory device and a method for manufacturing the same.

BACKGROUND

Although conventionally, high integration of a semiconductor memory device is being promoted, a method for increasing the degree of integration by the enhancement of lithography and etching technologies is getting closer to its limit, and a stacked-type semiconductor memory device is proposed. In this stacked-type semiconductor memory device, a stacked body in which word lines and interlayer insulating films are alternately stacked and a silicon pillar penetrating the stacked body are provided. A slit for separating the word line is formed in the stacked body.

DETAILED DESCRIPTION

According to one embodiment, a semiconductor memory device includes a substrate. The semiconductor memory device also includes a stacked body which is provided on the substrate and in which an insulating film and an electrode film are alternately stacked. The semiconductor memory device also includes an insulating member which penetrates the stacked body in a stacking direction of the insulating film and the electrode film to thereby separate the stacked body. The semiconductor memory device also includes a semiconductor pillar which penetrates the stacked body in the stacking direction. A maximum portion of the insulating member where a first distance from a side surface of the insulating member to a central plane of the insulating member becomes maximum and a maximum portion of the semiconductor pillar where a second distance from a side surface of the semiconductor pillar to a center line of the semiconductor pillar becomes maximum being provided in different positions in the stacking direction.

According to one embodiment, a method for manufacturing a semiconductor memory device includes a step of stacking a first insulating film and a first electrode film alternately on a substrate to thereby form a first stacked body, forming a first slit penetrating the first stacked body in a stacking direction of the first insulating film and the first electrode film and forming a filling film within the first slit to thereby form a first structure member. The method for manufacturing a semiconductor memory device also includes a step of stacking a second insulating film and a second electrode film on the first structure member to thereby form a second stacked body. The method for manufacturing a semiconductor memory device also includes a step of forming on a side of the first slit, a memory hole penetrating the first stacked body and the second stacked body in the stacking direction. The method for manufacturing a semiconductor memory device also includes a step of forming a memory film on a side surface of the memory hole to thereby form a semiconductor pillar within the memory hole. The method for manufacturing a semiconductor memory device also includes a step of forming, immediately above the first slit, a second slit penetrating the second stacked body in the stacking direction. The method for manufacturing a semiconductor memory device also includes a step of removing the filing film within the first slit and filling the first slit and the second slit with an insulating material to thereby form an insulating member.

Hereinafter, embodiments of the invention will be described with reference to the drawings.

First Embodiment

First, a first embodiment will first be described.

Figure 1:
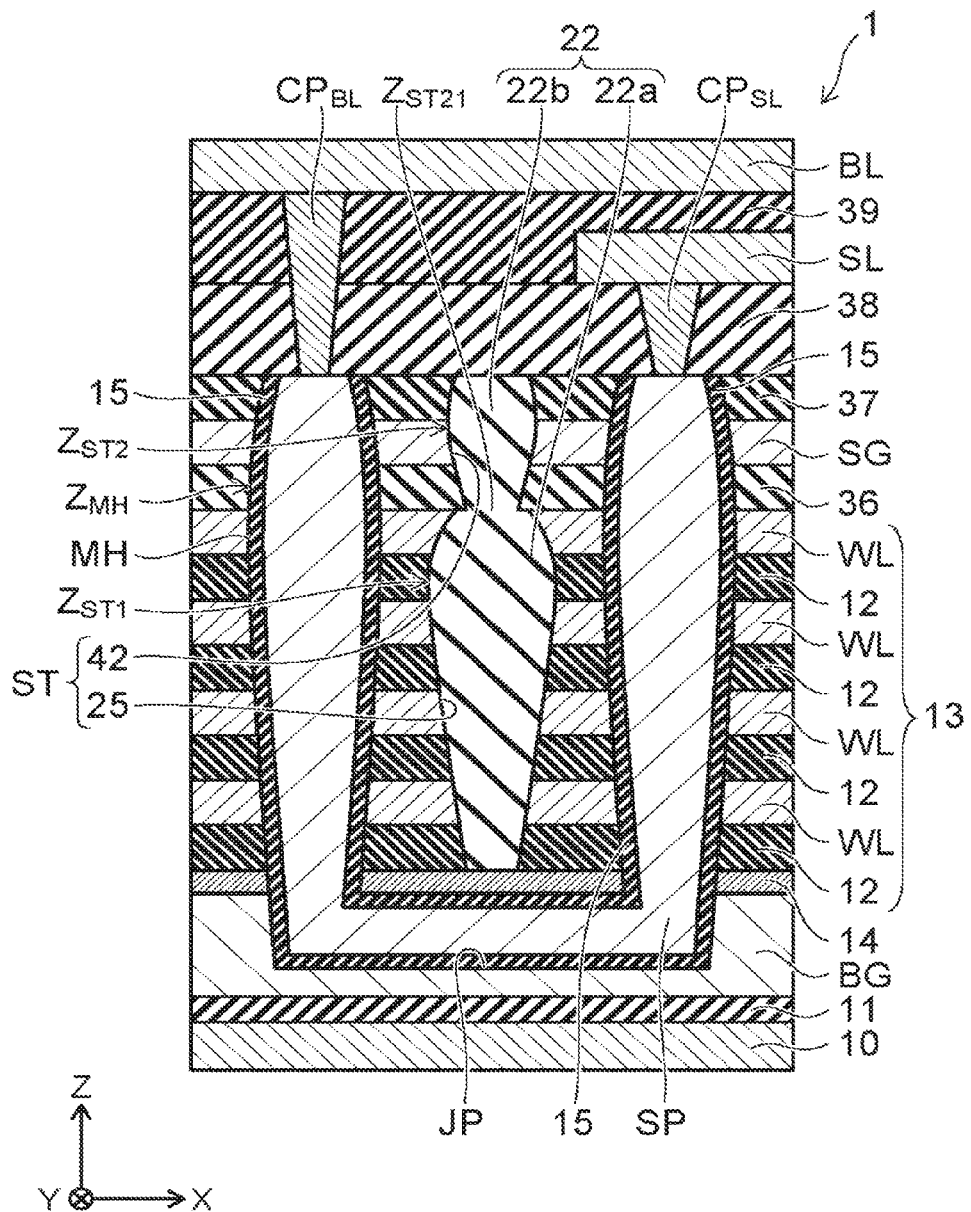
FIG. 1 is a cross-sectional view illustrating a semiconductor memory device according to a first embodiment.

FIG. 1 is a cross-sectional view illustrating a semiconductor memory device according to the embodiment.

Figure 2:
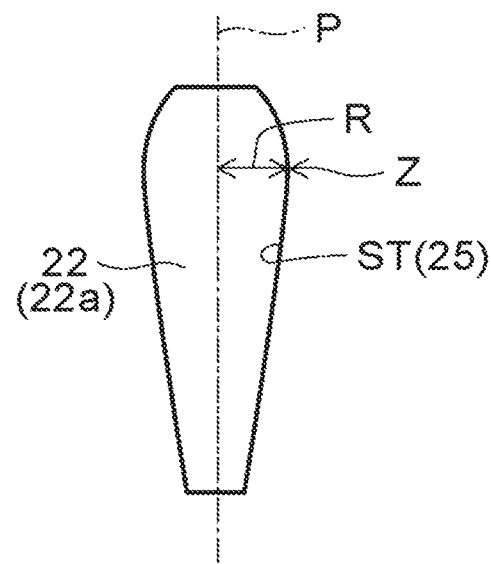
FIG. 2 is a cross-sectional view illustrating a slit and a memory hole of the semiconductor memory device according to the first embodiment.

FIG. 2 is a cross-sectional view illustrating a slit and a memory hole of the semiconductor memory device according to the embodiment.

The semiconductor memory device according to the embodiment is a stacked-type semiconductor memory device.

As shown in FIG. 1, in the semiconductor memory device according to the embodiment, a silicon substrate 10 is provided in the lowermost layer, and an insulating film 11 is provided on the silicon substrate 10.

Hereinafter, in the following specification, for convenience of explanation, an XYZ orthogonal coordinate system will be adopted. Namely, in FIG. 1, two directions parallel to a contact face of the silicon substrate 10 and the insulating film 11 and orthogonal to each other are assumed to be an "X-direction" and a "Y-direction". An upward direction perpendicular to the contact face of the silicon substrate 10 and the insulating film 11 is assumed to be a "Z-direction".

A back gate electrode BG, a stopper film 14, a stacked body 13, an interlayer insulating film 36, a selection gate electrode SG, an interlayer insulating film 37, an interlayer insulating film 38, an interlayer insulating film 39, a source line SL and a bit line BL, from below along the Z-direction, are provided on the insulating film 11 of the semiconductor memory device 1. The stacked body 13 is formed by alternately and repeatedly stacking an interlayer insulating film 12 and a word line WL.

A lower portion 25 of the slit ST for separating the word line WL is formed on the stopper film 14 so as to penetrate the stacked body 13 in the Z-direction. An upper portion 42 of the slit ST is formed on the lower portion 25 of the slit ST so as to penetrate the stacked body in the Z-direction from the interlayer insulating film 37 to the interlayer insulating film 36. An insulating member 22 formed of an insulating material is provided within the lower portion 25 of the slit ST and the upper portion 42 of the slit ST. The insulating member 22 extends in the Y-direction.

The memory holes MH are formed on the insulating film 11 so as to penetrate the stacked body in the Z-direction from the interlayer insulating film 37 to the upper layer portion of the back gate electrode BG. The lower end of each of a pair of memory holes MH is connected to a joint portion JP that is provided within the back gate electrode BG and that extends in the X-direction. The pair of memory holes MH and the joint portion JP are formed in the shape of the letter U.

A memory film 15 is provided on the side surface of the pair of memory holes MH and the joint portion JP. A silicon pillar SP is provided on the side of a center axis of the memory film 15. In this way, the silicon pillar SP is formed in the shape of the letter U. In the memory film 15, a block insulating film, a charge film and a tunnel insulating film are stacked and formed sequentially from the outside. In this way, a memory cell is formed in a portion where the word line WL and the silicon pillar SP intersect each other.

A contact plug $CP_{SL}$ embedded into the interlayer insulating film 38 is provided on one end of the silicon pillar SP in the shape of the letter U. The source line SL embedded into the interlayer insulating film 39 and extending in the Y-direction is provided on the contact plug $CP_{SL}$. A contact plug $CP_{BL}$ embedded into the interlayer insulating film 38 and the interlayer insulating film 39 is provided on the other end of the silicon pillar SP. The bit line BL extending in the X-direction is provided on the contact plug $CP_{BL}$ and the interlayer insulating film 39.

The insulating film 11 and the interlayer insulating films 12 and 36 to 39 are formed of, for example, silicon oxide (SiO). The back gate electrode BG, the word line WL and the selection gate electrode SG are formed of, for example, silicon (Si) and a metal silicide containing boron (B). The stopper film 14 is formed of, for example, tantalum (Ta). The contact plug $CP_{SL}$, the contact plug $CP_{BL}$, the source line SL and the bit line BL are formed of, for example, tungsten (W).

Each of the cross-sectional shapes of the lower portion 22a of the insulating member 22, the upper portion 22b of the insulating member 22 and the silicon pillar SP is formed as shown in FIG. 2 because of a high processing aspect. This shape is characterized in that its part slightly swells in a position slightly away from the upper end. This shape is referred to as a bowing shape. A portion where the distance R from the side wall of the slit to a center line P of the slit is maximized is referred to as a maximum bowing portion Z.

Since the position of the upper end of the silicon pillar SP and the position of the upper end of the lower portion 22a of the insulating member 22 are different from each other, the position of the maximum bowing portion $Z_{MH}$ of the silicon pillar SP and the maximum bowing portion $Z_{ST1}$ of the lower portion 22a of the insulating member 22 are displaced in the Z-direction. A minimum point where the distance from the side wall of the insulating member 22 to the central plane becomes minimum is $Z_{ST21}$ as shown in FIG. 1.

Furthermore, although the position of the upper end of the silicon pillar SP and the position of the upper end of the upper portion 22b of the insulating member 22 are located in the position of the same height, since their lengths are different, the position of the maximum bowing portion $Z_{MH}$ of the silicon pillar SP and the position of the maximum bowing portion $Z_{ST2}$ of the upper portion 22b of the insulating member 22 are displaced in the Z-direction. Moreover, since the length of the upper portion 22b in the Z-direction is shorter than the length of the lower portion 22a and the length of the silicon pillar SP, the width of the maximum bowing portion $Z_{ST2}$ of the upper portion 22b is less than that of the lower portion 22a and the silicon pillar SP.

Next, a method for manufacturing the semiconductor memory device according to the embodiment will be explained.

FIGS. 3 to 17 are cross-sectional views illustrating the method for manufacturing the semiconductor memory device according to the embodiment.

Figure 3:
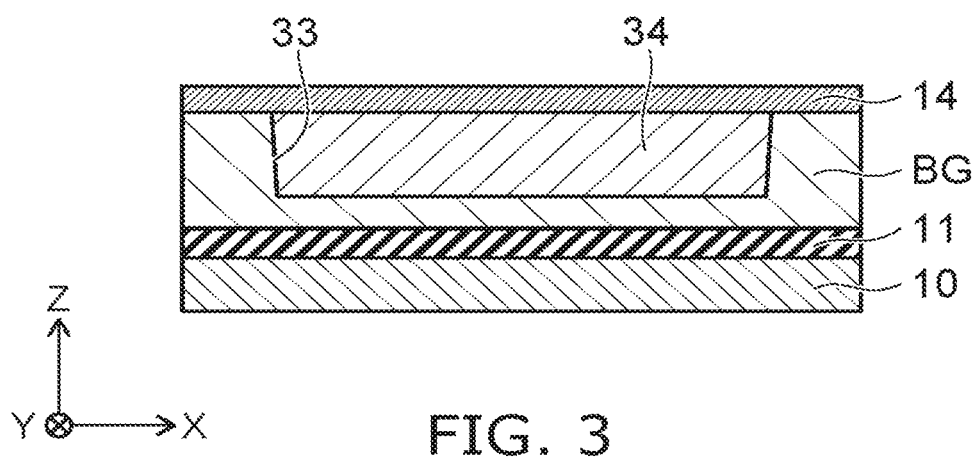
FIGS. 3 to 17 are cross-sectional views illustrating the method for manufacturing the semiconductor memory device according to the first embodiment.

First, as shown in FIG. 3, the insulating film 11 made of silicon oxide (SiO) is formed on the silicon substrate 10 by, for example, HDP-CVD (High Density Plasma Chemical Vapor Deposition), and the back gate electrode BG is formed thereon. Thereafter, the range of formation of a groove 33 is identified by lithography, and etching is performed to selectively remove the back gate electrode BG and to form the groove 33. Thereafter, a sacrificial film 34 is formed within the groove 33 by, for example, deposition of non-doped silicon. The "non-doped" refers to the fact that an impurity for giving conductivity to silicon is not intentionally added and that no impurities are substantially included except for an element caused by a raw gas at the time of film formation. Thereafter, a stopper film 14 is formed on the back gate electrode BG and the sacrificial film 34 by deposition of, for example, tantalum (Ta).

Figure 4:
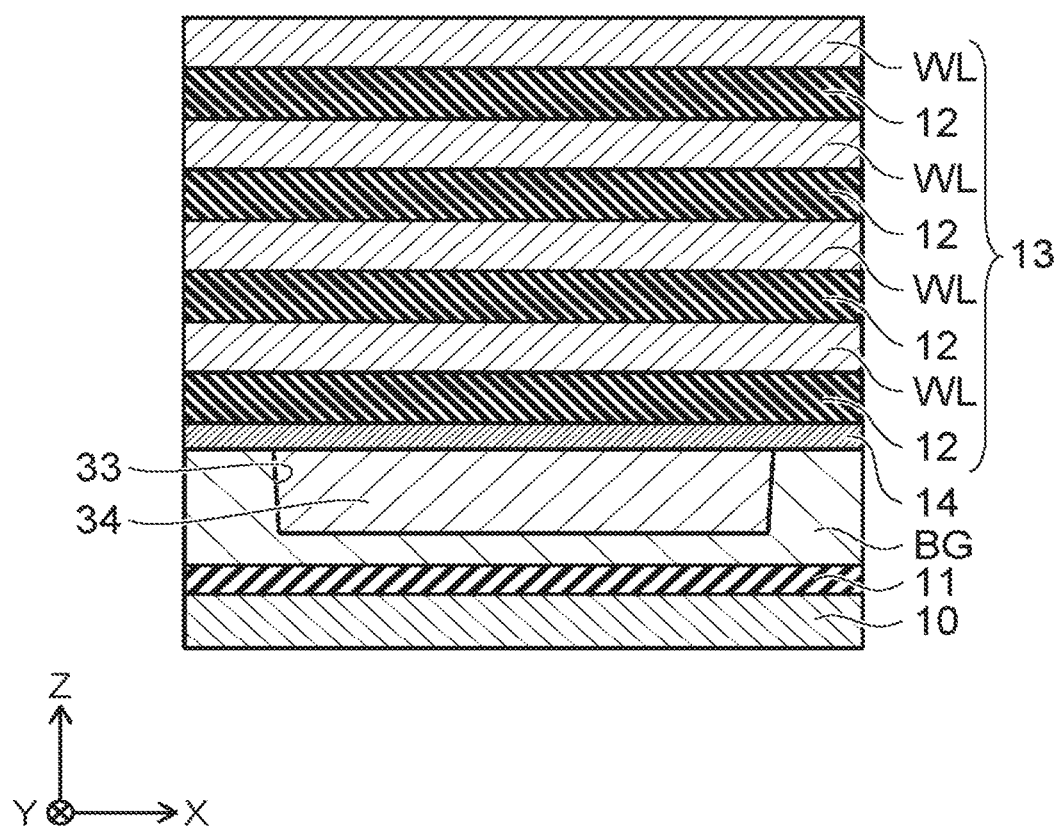

Next, as shown in FIG. 4, the stacked body 13 is formed by alternately depositing, on the stopper film 14, the interlayer insulating film 12 and the word line WL.

Figure 5:
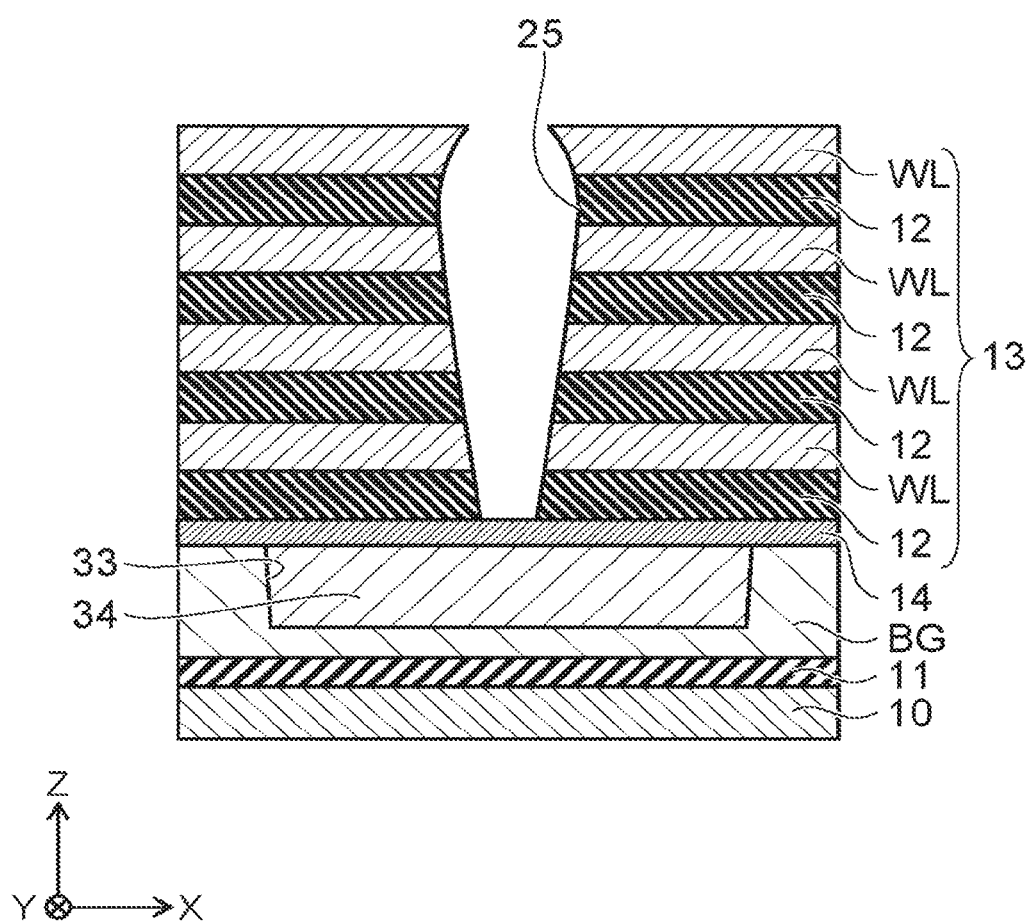

Subsequently, as shown in FIG. 5, the range of formation of the lower portion 25 of the slit ST is identified by, for example, lithography, the interlayer insulating film 12 and the word line WL are selectively removed by performing etching, and thus the lower portion 25 of the slit ST penetrating the stacked body 13 in the Z-direction and extending in the Y-direction is formed. In this way, the word line WL is separated in the X-direction. At this time, the cross-sectional shape of the lower portion 25 of the slit ST becomes a shape shown in FIG. 2 because of a high aspect ratio.

Namely, as described above, as shown in FIG. 2, the cross-sectional shape of the slit ST becomes a bowing shape where its part slightly swells in a position slightly away from the upper end of the slit ST. For example, when a slit is formed in a stacked body made of a word line and an interlayer insulating film and having a thickness of 1.5 μm, the maximum bowing portion Z is located approximately 300 nm away from the upper end of the slit.

Figure 6:
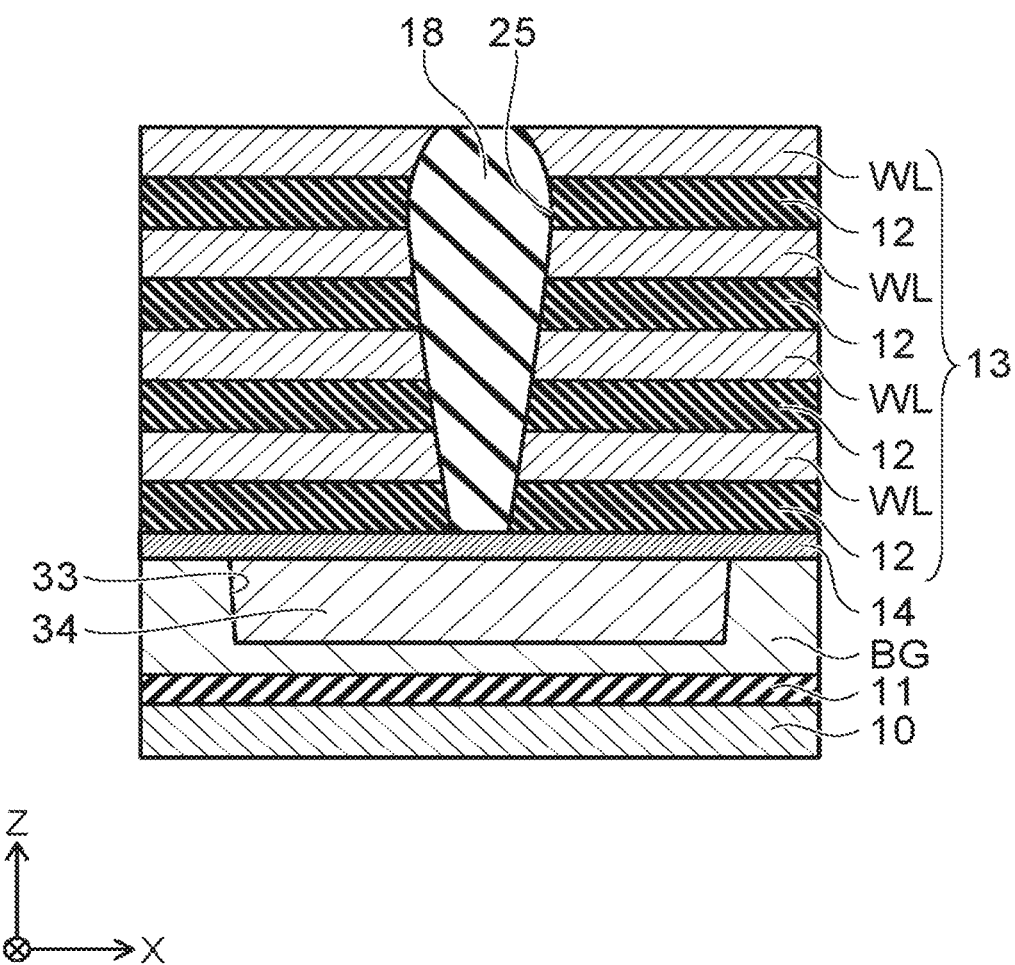

Then, as shown in FIG. 6, a filling film 18 is formed by embedding a material made of, for example, amorphous silicon (aSi), silicon nitride (SiO), silicon oxide (SiN) or the like, into the lower portion 25 of the slit ST.

Figure 7:
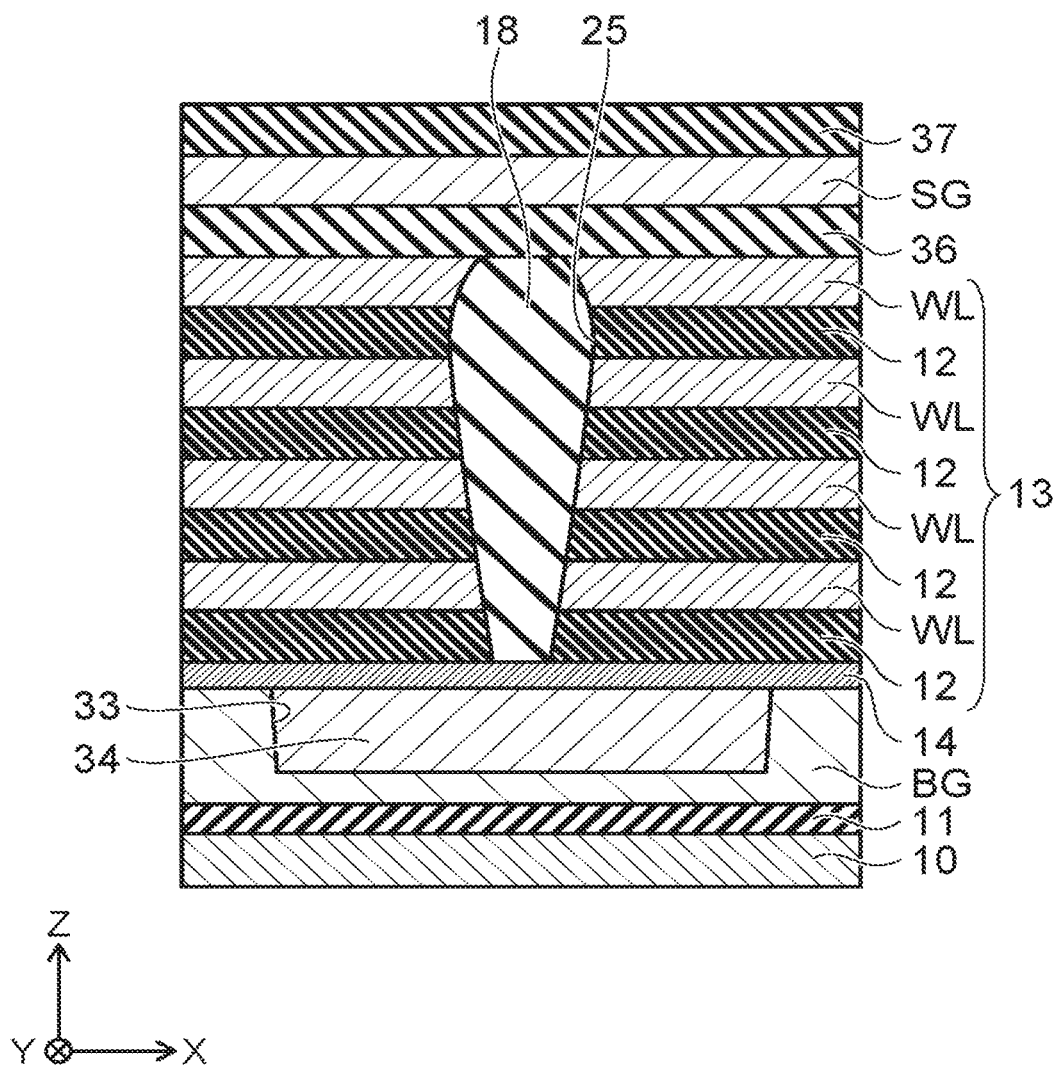

After that, as shown in FIG. 7, the interlayer insulating film 36, the selection gate electrode SG and the interlayer insulating film 37 are stacked in this order on the stacked body 13 and the filling film 18.

Figure 8:
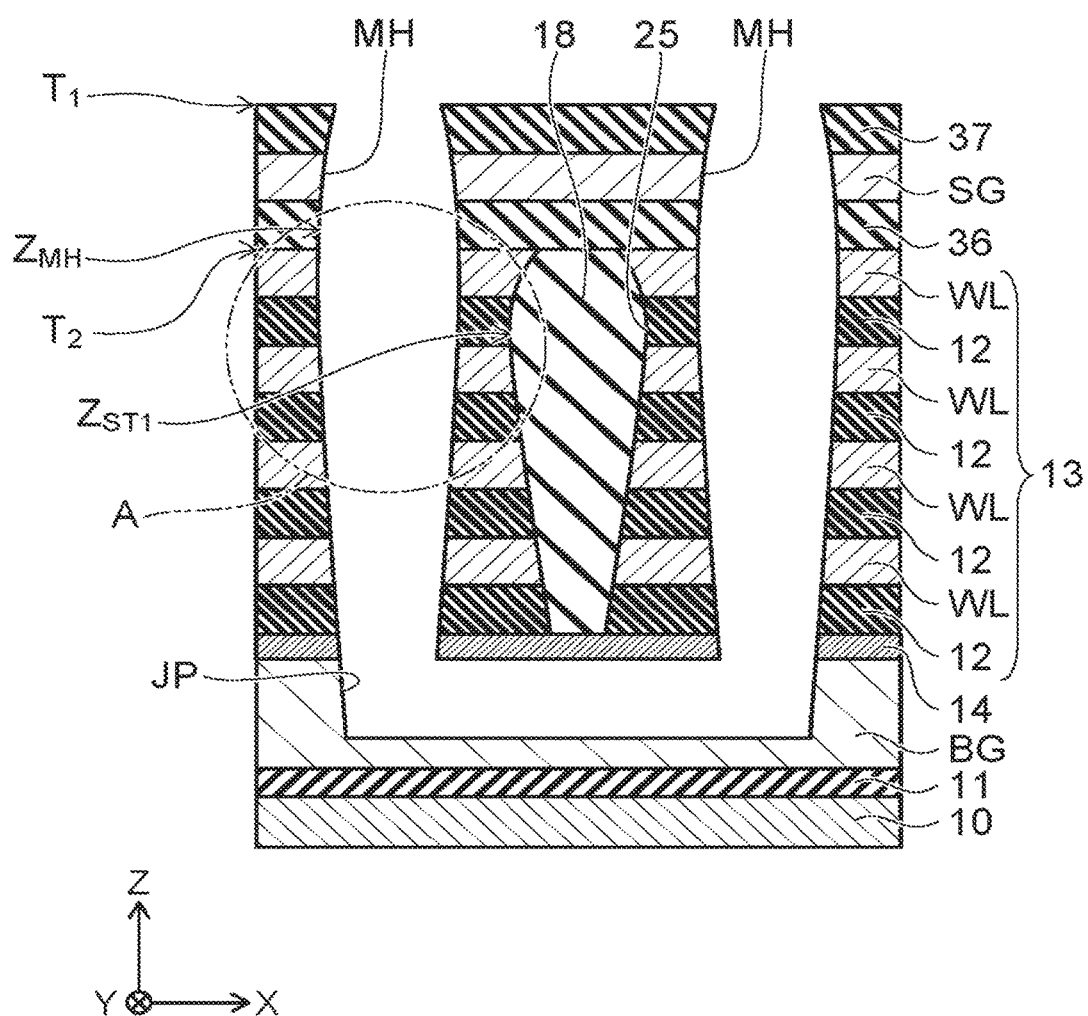

Subsequently, as shown in FIG. 8, the range of formation of the memory hole MH is identified by lithography, the stacked body from the interlayer insulating film 37 to the stopper film 14 is selectively removed by performing etching and thus the memory hole MH penetrating this stacked body in the Z-direction is formed. At this time, the cross-section shape of the memory hole MH becomes a bowing shape in the same way as the lower portion 25 of the slit ST because of a high aspect ratio. However, since the position $T_1$ of the upper end of the memory hole MH is higher than the position $T_2$ of the upper end of the lower portion 25, as indicated by a part A in FIG. 8, the position of the maximum bowing portion $Z_{MH}$ of the memory hole MH can be set higher than the position of the maximum bowing portion $Z_{ST1}$ of the lower portion 25.

The lower end of the memory hole MH reaches the sacrificial film 34, and the sacrificial film 34 is exposed to the lower end of the memory hole MH. A pair of memory holes MH is formed on one sacrificial film 34 so as to sandwich the insulating member 18. After that, the sacrificial film 34 of non-doped silicon is removed by, for example, wet etching.

The groove 33 formed within the back gate electrode BG emerges by the removal of the sacrificial film 34. The groove 33 that emerges is referred to as the joint portion JP. A pair of the memory holes MH is connected to one joint portion JP. The lower end of each of the pair of the memory holes MH is connected to one common joint portion JP and one cavity in the shape of the letter U is formed.

Figure 9:
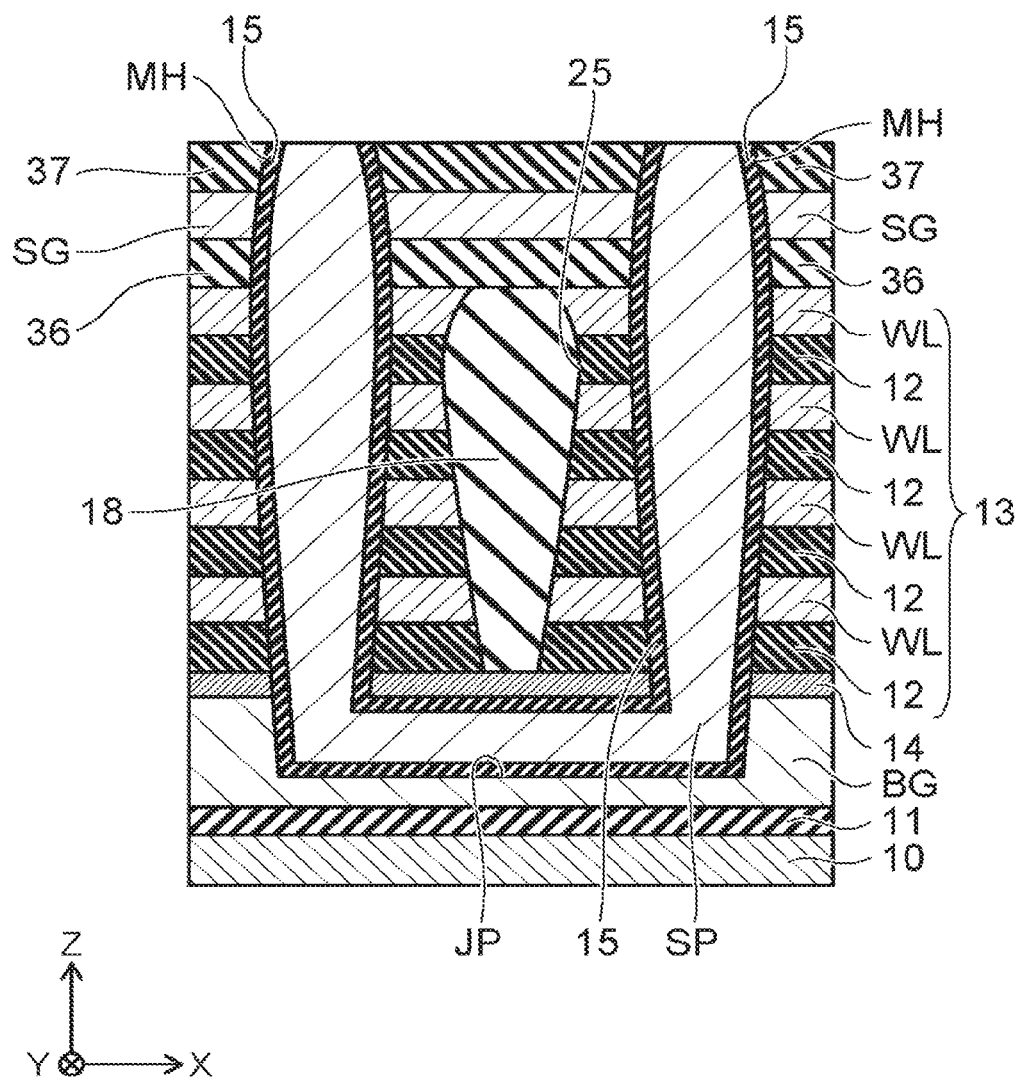

Next, as shown in FIG. 9, a block insulating film, a charge film and a tunnel insulating film are formed in this order on the side surface of the pair of the memory holes MH and the joint portion JP, and thus the memory film 15 is formed. Thereafter, the silicon pillar SP is formed by embedding the pair of the memory holes MH and the joint portion JP by using, for example, silicon.

Figure 10:
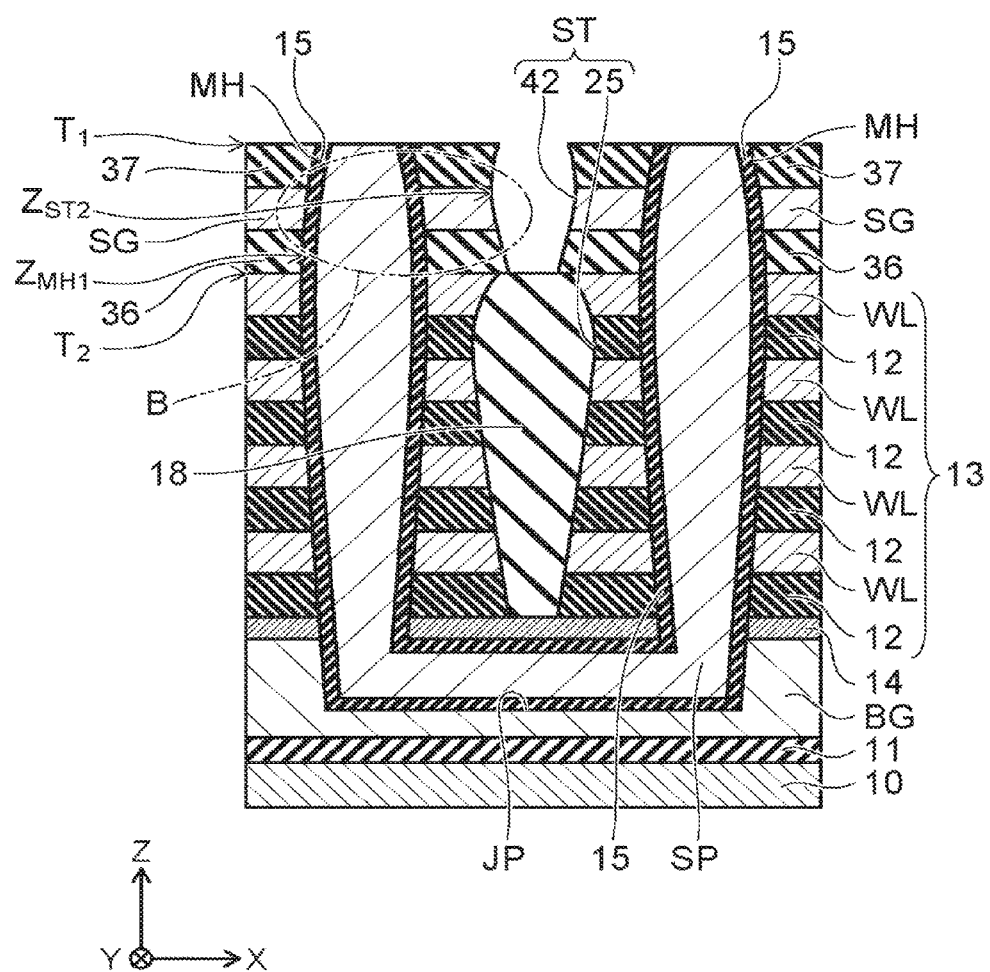

Then, as shown in FIG. 10, the range of formation of the upper portion 42 of the slit ST is identified by lithography, the stacked body from the interlayer insulating film 37 and the interlayer insulating film 36 is selectively removed by performing etching and thus the upper portion 42 of the slit ST penetrating the stacked body in the Z-direction and extending in the Y-direction is formed. The central plane of the upper portion 42 of the slit ST is aligned with the central plane of the lower portion 25 of the slit ST. At this time, the cross-sectional shape of the upper portion 42 of the slit ST becomes a bowing shape because of a high aspect ratio. After that, the position of the upper end of the memory hole MH and the position of the upper end of the upper portion 42 are located in the position $T_1$ of the same height. However, since their lengths are different from each other, as indicated by a part B in FIG. 10, the position $Z_{MH1}$ of the maximum bowing portion of the memory hole MH and the position $Z_{ST2}$ of the maximum bowing portion of the upper portion 42 can be displaced in the Z-direction. Furthermore, since the length of the upper portion 42 in the Z-direction is shorter than the length of the lower portion 25 and the length of the memory hole MH, the width of the maximum bowing portion $Z_{ST2}$ of the upper portion 42 is less than that of the lower portion 25 and the memory hole MH.

Figure 11:
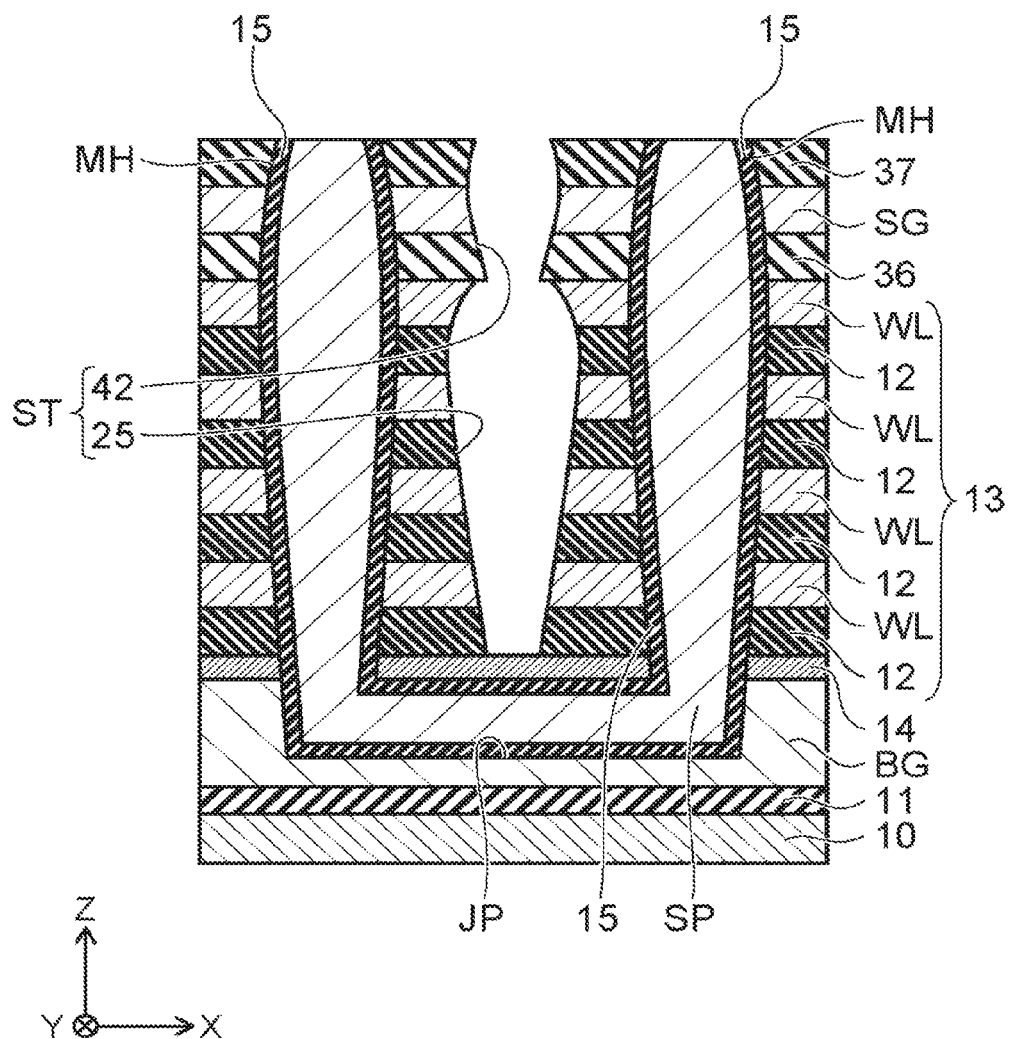

Subsequently, as shown in FIG. 11, the filling film 18 is removed by performing etching on the filling film 18 within the lower portion 25 of the slit ST, with the result that the desired shape of the lower portion 25 of the slit ST is obtained.

Figure 12:
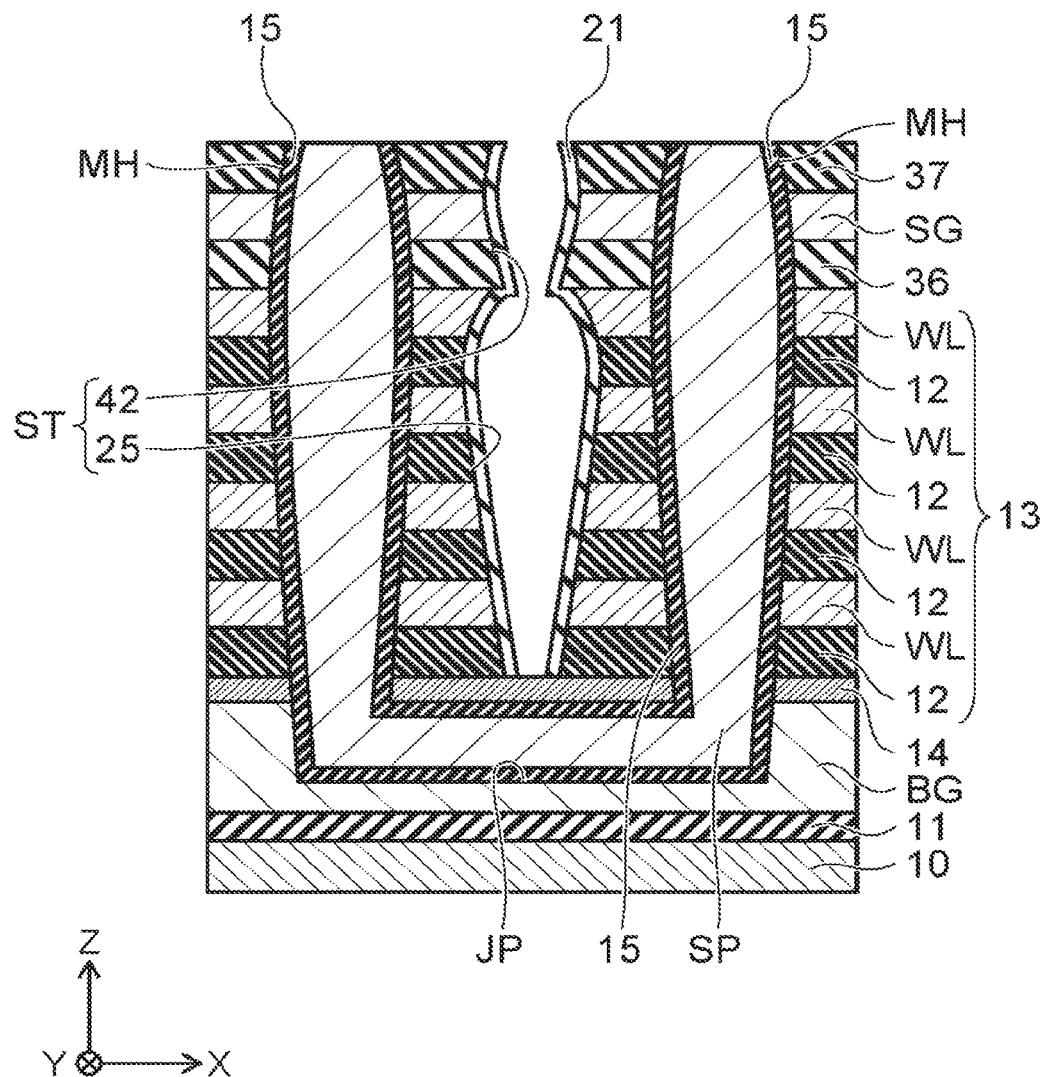

Next, as shown in FIG. 12, a metal film 21 is formed by depositing a metal such as nickel (Ni) or cobalt (Co) within the slit ST and a silicide (not shown) is formed by reaction with the silicon of the word line WL.

Figure 13:
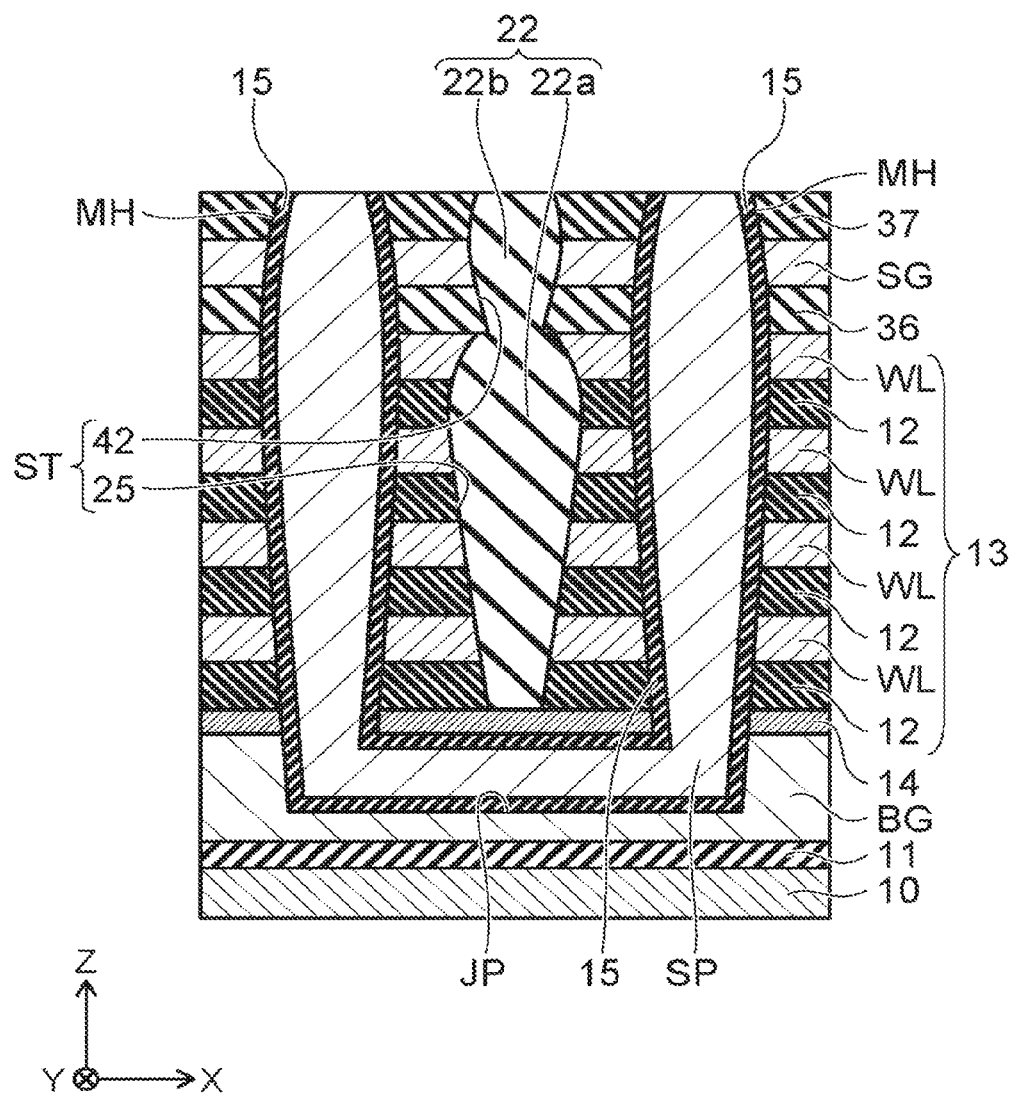

Then, as shown in FIG. 13, an unreacted part of the metal film 21 is removed. After that, the insulating member 22 is formed by embedding an insulating material into the slit ST.

Figure 14:
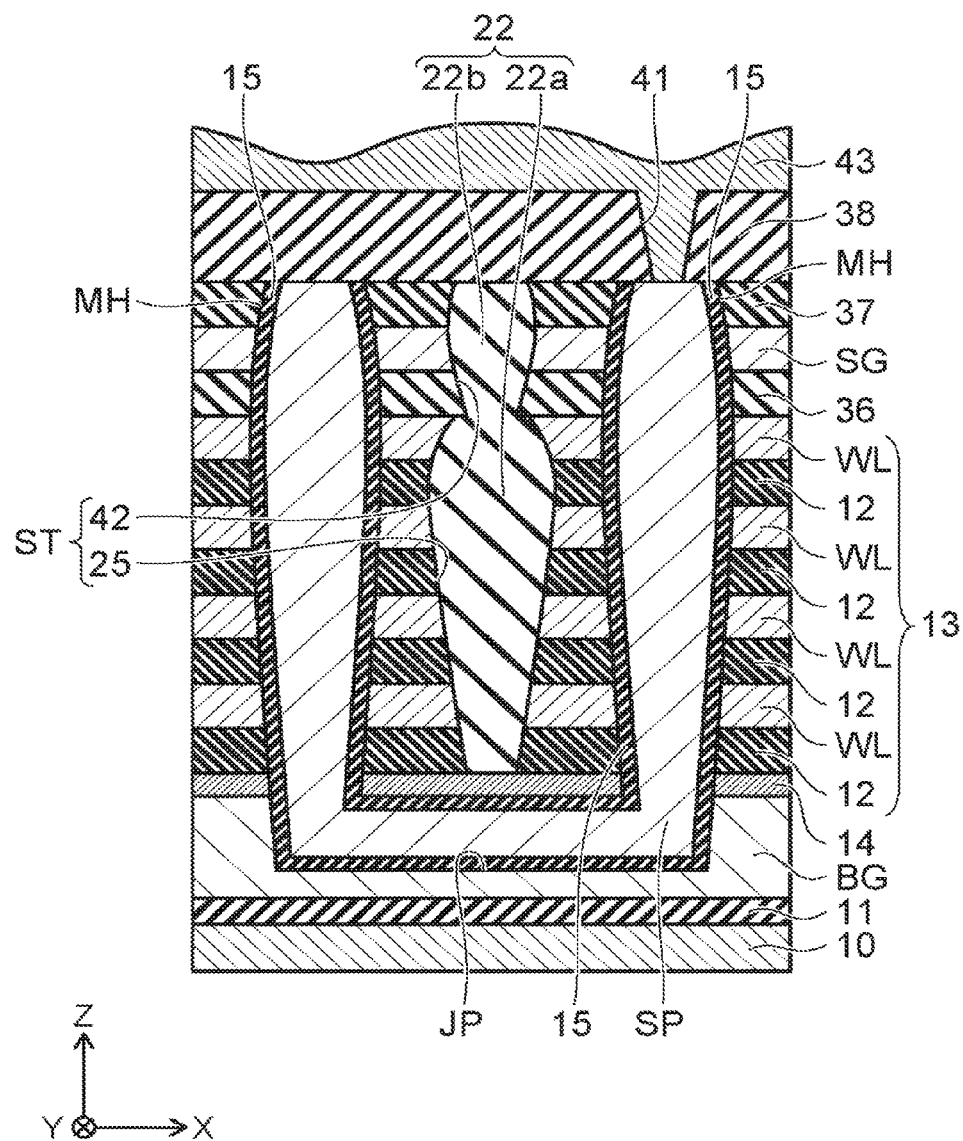

Subsequently, as shown in FIG. 14, a contact hole 41 is formed by forming the interlayer insulating film 38 on the interlayer insulating film 37 to thereby form a flat face, and then by performing lithography and etching. Thereafter, a conductive film 43 is formed by depositing, for example, tungsten (W) on the interlayer insulating film 38 and the contact hole 41.

Figure 15:
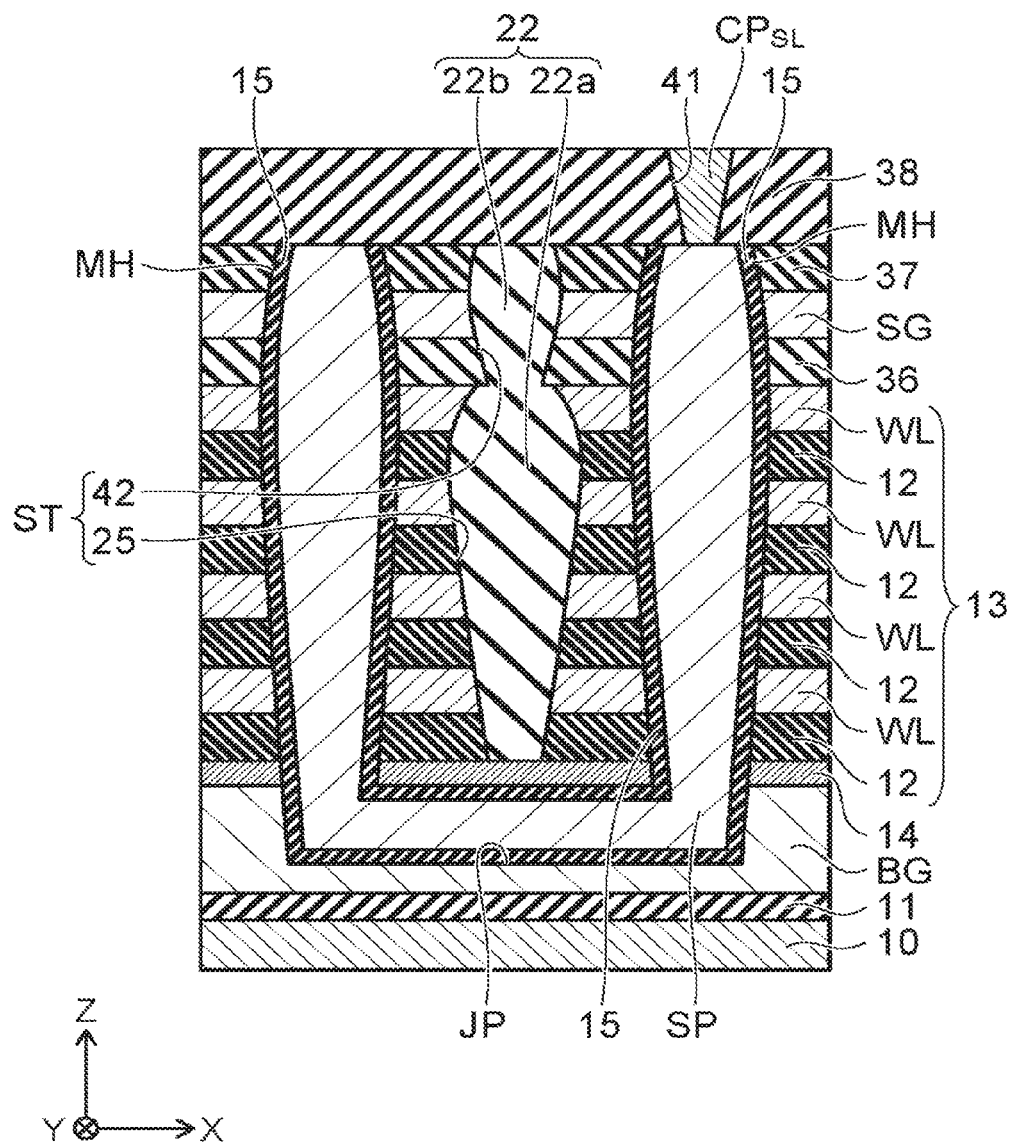

Then, as shown in FIG. 15, a contact plug $CP_{SL}$ is formed within the contact hole 41 by removing the conductive film 43 formed on the upper face of the interlayer insulating film 38 through, for example, a CMP method.

Figure 16:
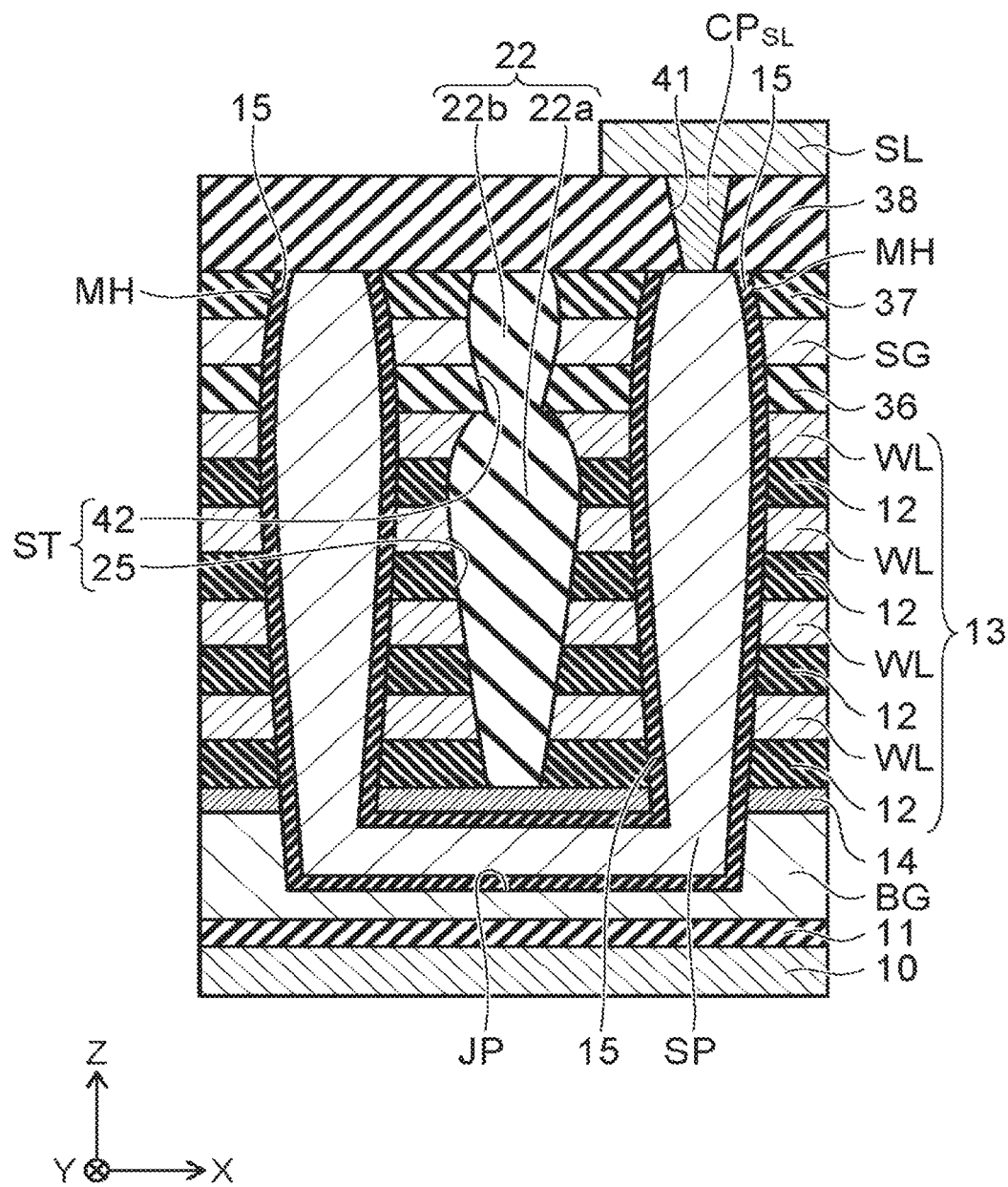

Next, as shown in FIG. 16, the source line SL extending in the Y-direction is formed on the contact plug $CP_{SL}$ by, for example, a damascene method.

Figure 17:
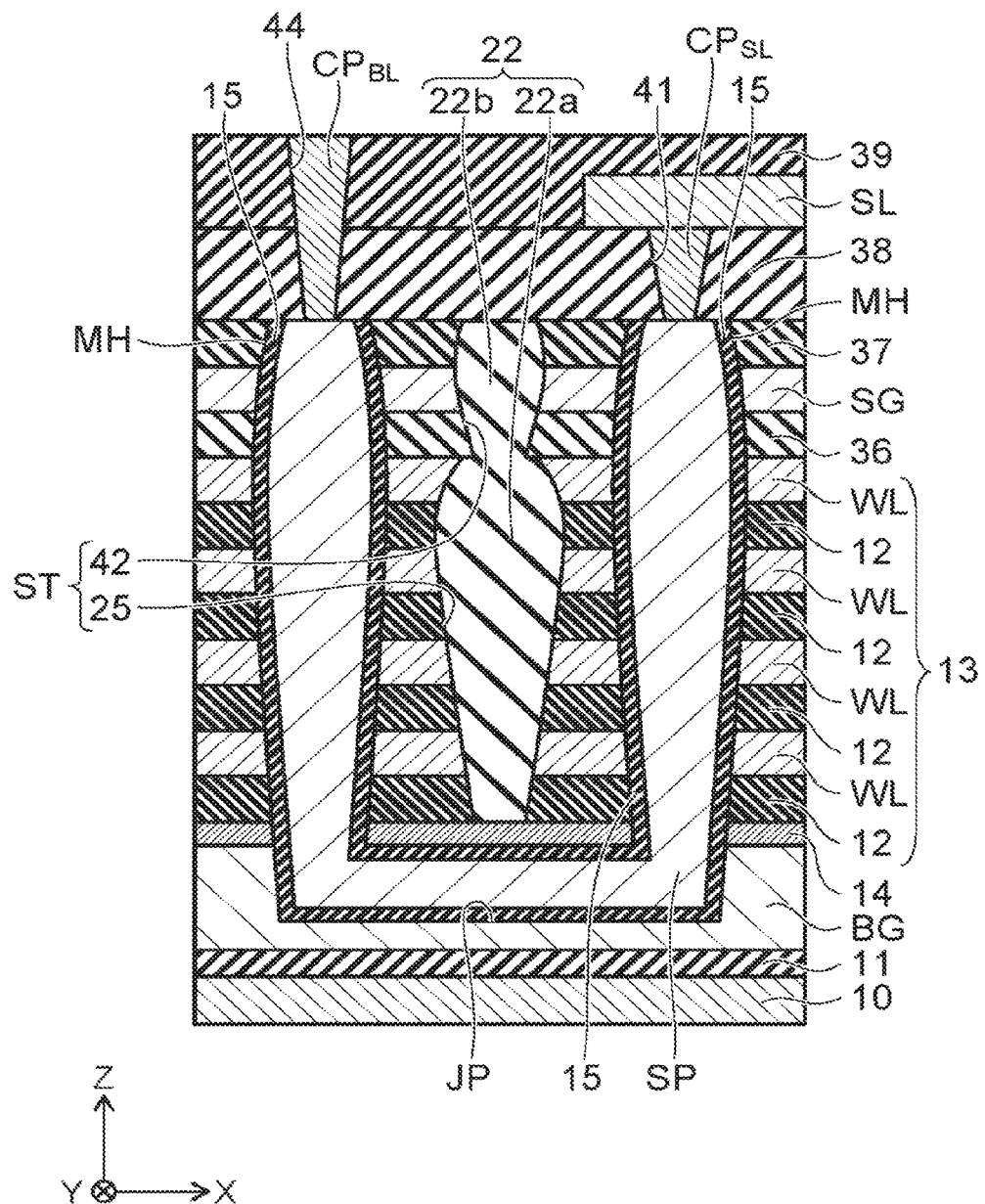

Then, as shown in FIG. 17, a contact hole 44 is formed by formation of the interlayer insulating film 39 on the interlayer insulating film 38 and the source line SL, and then by performing lithography and etching. Thereafter, a contact plug $CP_{BL}$ is formed by the same method as the method for forming the contact plug $CP_{SL}$.

After that, as shown in FIG. 1, the bit line BL extending in the X-direction is formed on the contact plug $CP_{BL}$ by, for example, the damascene method, and thus the semiconductor memory device 1 is manufactured.

Subsequently, the effects of the embodiment will be described.

In the semiconductor memory device according to the embodiment, the position of the upper end of the silicon pillar SP is caused to differ from the position of the upper end of the lower portion 22a of the insulating member 22, and thus it is possible to displace, in the Z-direction, the position of the maximum bowing portion $Z_{MH}$ of the silicon pillar SP and the position of the maximum bowing portion $Z_{ST1}$ of the lower portion 22a of the insulating member 22. Furthermore, the position of the upper end of the silicon pillar SP and the position of the upper end of the upper portion 22b of the insulating member 22 are located at the same height, but since their lengths are different from each other, it is possible to displace, in the Z-direction, the position of the maximum bowing portion $Z_{MH}$ of the silicon pillar SP and the position of the maximum bowing portion $Z_{ST2}$ of the upper portion 22b of the insulating member 22. Furthermore, since the length of the upper portion 22b in the Z-direction is shorter than the length of the lower portion 22a and the length of the silicon pillar SP, the width of the maximum bowing portion $Z_{ST2}$ of the upper portion 22b is less than that of the lower portion 22a and the silicon pillar SP.

As a result, the minimum distance between the silicon pillar SP and the insulating member 22 is increased, and thus it is possible to prevent the silicon pillar SP and the insulating member 22 from being excessively close to each other. Since the minimum cross-sectional area of the word line WL sandwiched between the silicon pillar SP and the insulating member 22 on the XZ plane can be acquired so as to be not less than a prescribed value, it is possible to lower the wiring resistance of the word line WL.

Although in the embodiment, the example has been described in which the lower portion 25 of the slit ST is formed, then the memory hole MH is formed and thereafter the upper portion 42 of the slit ST is formed, there is no restriction on this example. There may be adopted a configuration in which the upper portion 42 of the slit ST is formed after formation of the lower portion 25 of the slit ST and then, the memory hole MH is formed.

Furthermore, after separately forming the slit ST by using not less than three processes, the insulating member 22 may be formed by embedding an insulating material into the slit ST.

Modification of the First Embodiment

Next, a modification of the first embodiment will be described.

Figure 18:
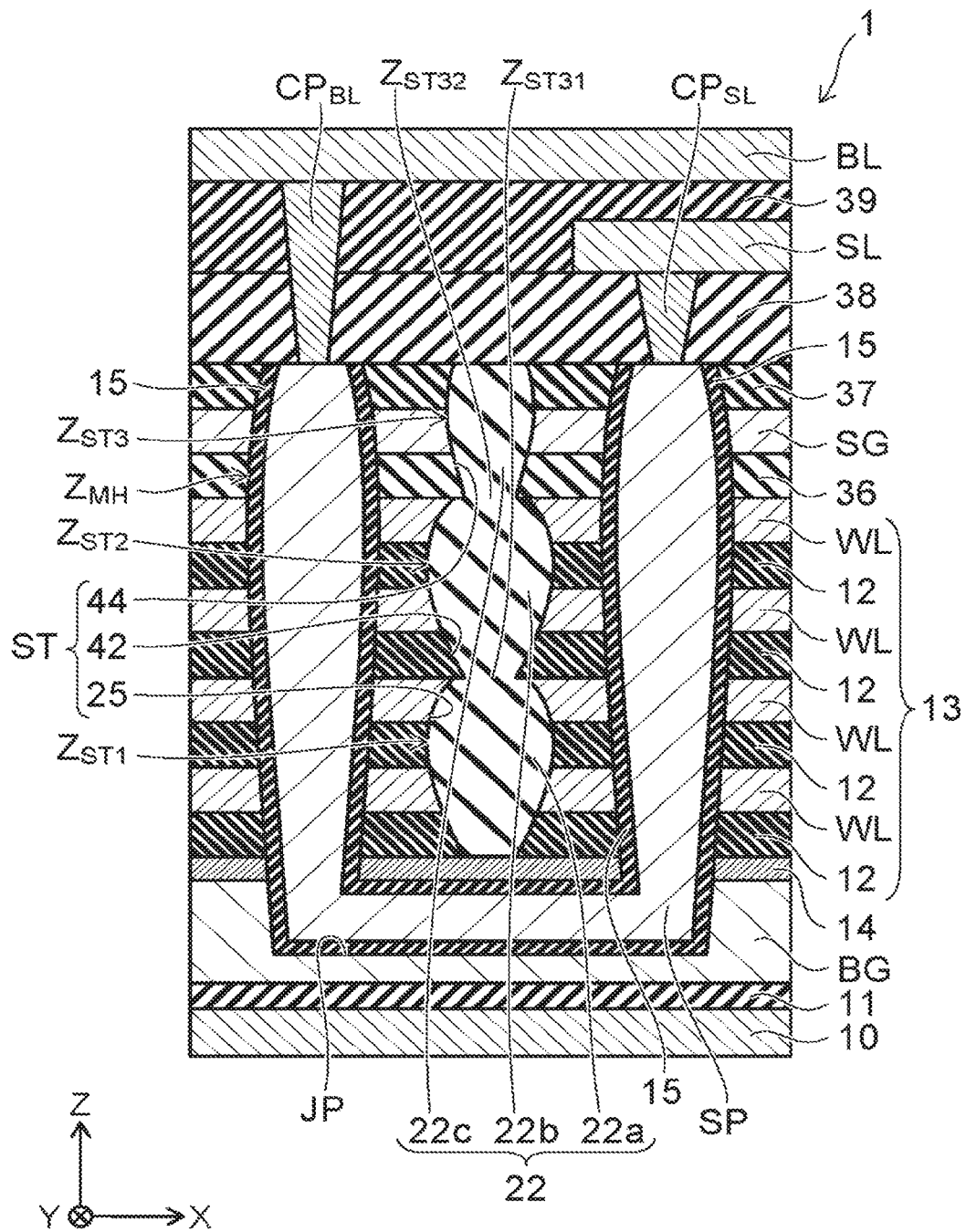
FIG. 18 is a cross-sectional view illustrating a semiconductor memory device according to a variation of the first embodiment.

FIG. 18 is a cross-sectional view illustrating a semiconductor memory device according to the variation.

As shown in FIG. 18, in the semiconductor memory device 1 in a case of separately forming the slit ST by using, for example, three processes, in the Z-direction, the position of the maximum bowing portion $Z_{MH}$ of the silicon pillar SP is provided to be higher than the position of the maximum bowing portion $Z_{ST2}$ of the insulating member 22. Furthermore, there are two points $Z_{ST31}$ and $Z_{ST32}$, as the minimum point where the distance from the side wall of the insulating member 22 to the central plane becomes minimum, as shown in FIG. 16.

The configurations, the manufacturing method and the effects other than what has been described above in the variation are the same as in the first embodiment described above.

Second Embodiment

Subsequently, a second embodiment will be described.

Figure 19:
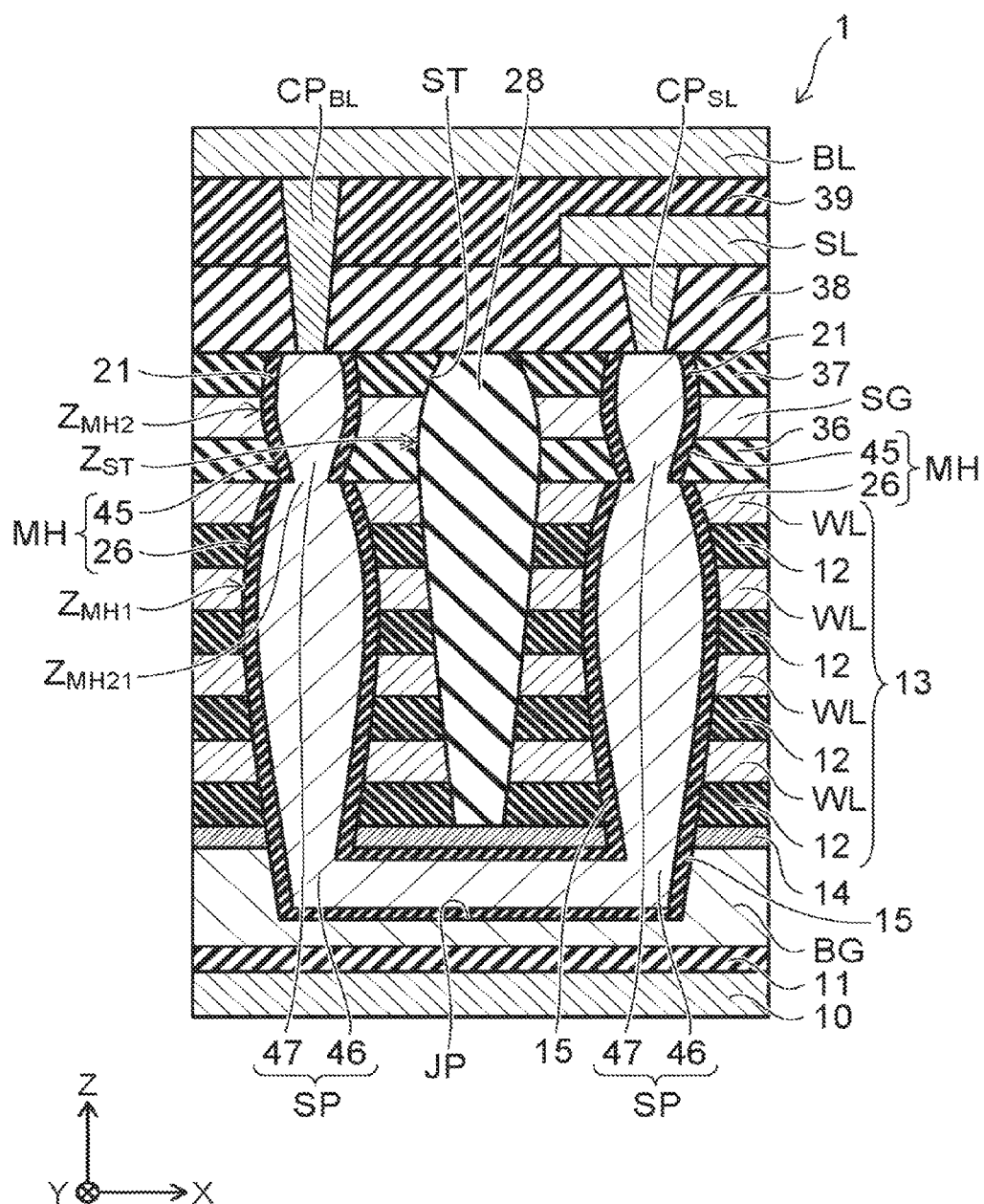
FIG. 19 is a cross-sectional view illustrating a semiconductor memory device according to a second embodiment.

FIG. 19 is a cross-sectional view illustrating a semiconductor memory device according to the embodiment.

In the semiconductor memory device 1 according to the embodiment, the memory hole MH that penetrates, in the Z-direction, the stacked body from the interlayer insulating film 37 to the upper layer portion of the back gate electrode BG is formed by being etched twice, and the slit ST that penetrates, in the Z-direction, the stacked body from the interlayer insulating film 37 to the stacked body 13 is formed by being etched once.

Consequently, as shown in FIG. 19, the semiconductor memory device 1 according to the embodiment differs from the above-described semiconductor memory device (see FIG. 1) according to the first embodiment in the following points (a) to (e).

(a) The silicon pillar SP is divided into an upper portion 47 and a lower portion 46, and the cross section of each of them has the bowing shape.

(b) An insulating member 28 is not divided, and its cross section has one bowing shape.

(c) Since the upper end of the lower portion 46 of the silicon pillar SP and the upper end of the insulating member 28 are located in different positions, the position of the maximum bowing portion $Z_{MH1}$ of the lower portion 46 and the position of the maximum bowing portion $Z_{ST}$ of the insulating member 28 are displaced in the Z-direction.

(d) The upper end of the upper portion 47 of the silicon pillar SP and the upper end of the insulating member 28 are located in the position of the same height, but since their lengths are different from each other, the position of the maximum bowing portion $Z_{MH2}$ of the upper portion 47 and the position of the maximum bowing portion $Z_{ST}$ of the insulating member 28 are displaced in the Z-direction.

(e) A minimum point where the distance from the side wall of the silicon pillar SP to the center line becomes minimum is $Z_{MH21}$ as shown in FIG. 19.

The configurations other than what has been described above in the embodiment are the same as in the first embodiment described above.

Then, a method for manufacturing the semiconductor memory device according to the embodiment will be described.

FIGS. 20 to 25 are cross-sectional views illustrating the method for manufacturing the semiconductor memory device according to the embodiment.

First, a method for forming the stacked body 13 on the silicon substrate 10 from the beginning is the same as in the first embodiment described above.

Figure 20:
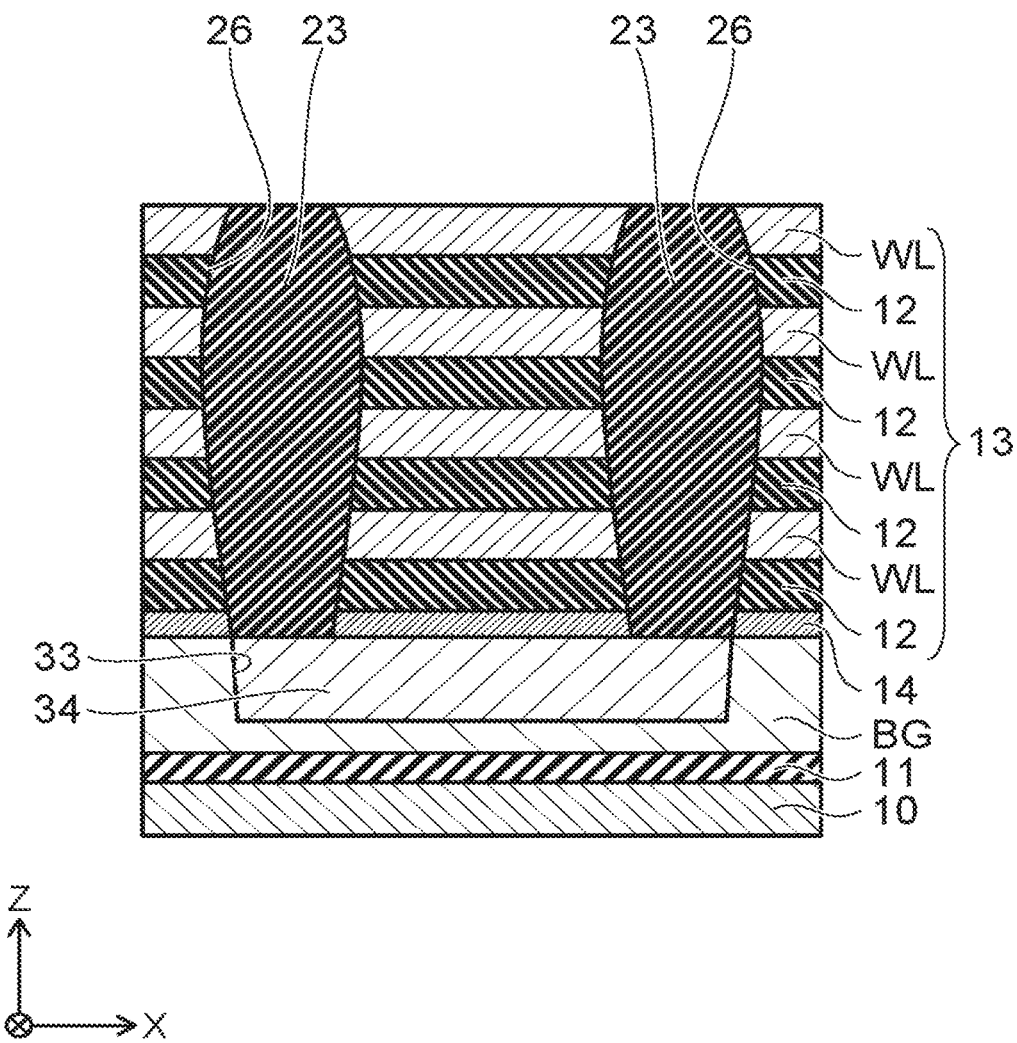
FIGS. 20 to 25 are cross-sectional views illustrating the method for manufacturing the semiconductor memory device according to the second embodiment.

After that, as shown in FIG. 20, the range of formation of the lower portion 26 of the memory hole MH is identified by, for example, lithography, the stacked body is selectively removed from the stacked body 13 to the upper layer portion of the back gate electrode BG by performing etching, and thus the lower portion 26 of the memory hole MH penetrating this stacked body in the Z-direction is formed. At this time, the cross-sectional shape of the lower portion 26 of the memory hole MH becomes a bowing shape because of a high aspect ratio. Thereafter, a filling film 23 is formed by embedding a material made of, for example, amorphous silicon (aSi), silicon nitride (SiO), silicon oxide (SiN) or the like into the lower portion 26 of the memory hole MH.

Figure 21:
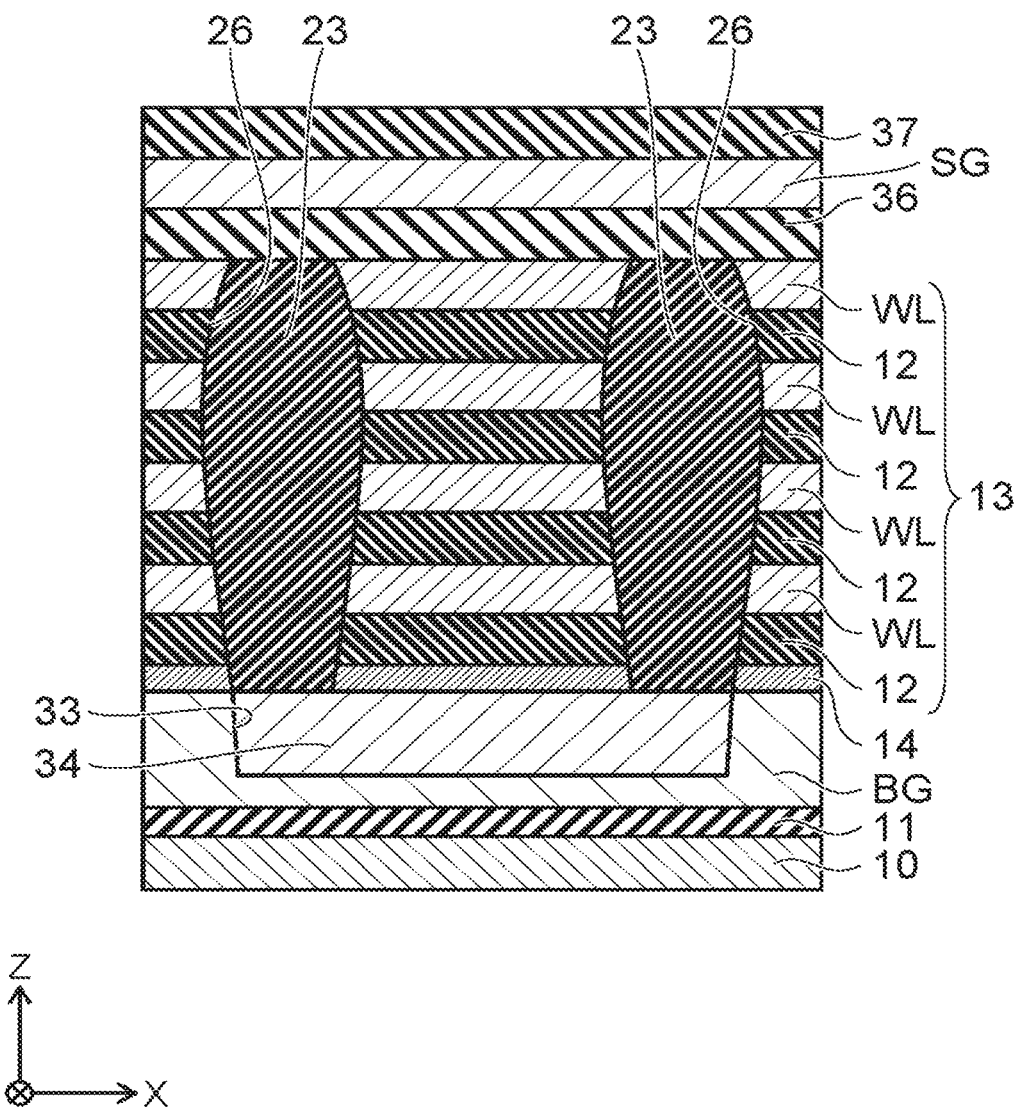

Next, as shown in FIG. 21, the interlayer insulating film 36, the selection gate electrode SG and the interlayer insulating film 37 are stacked in this order on the stacked body 13 and the filling film 23.

Figure 22:
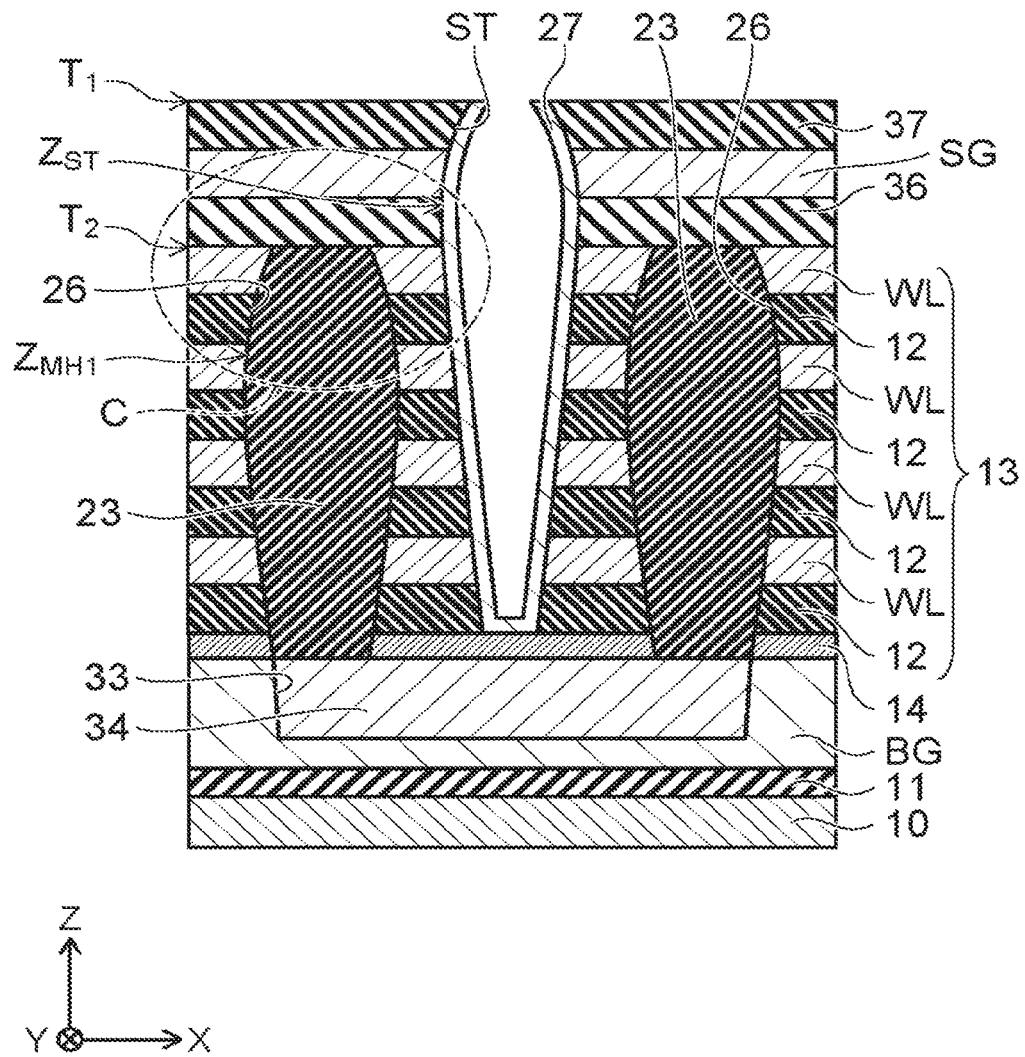

Then, as shown in FIG. 22, the range of formation of the slit ST is identified by lithography, the stacked body is selectively removed from the interlayer insulating film 37 to the stacked body 13 by performing etching, and thus the slit ST penetrating this stacked body in the Y-direction is formed. At this time, the cross-sectional shape of the slit ST also becomes a bowing shape in the same way as the lower portion 26 of the memory hole MH because of a high aspect ratio. However, since the position $T_1$ of the upper end of the slit ST is higher than the position $T_2$ of the upper end of the filling film 23, as indicated by a part C in FIG. 22, the position $Z_{ST}$ of the maximum bowing portion of the slit ST can be set higher than the position $Z_{MH1}$ of the maximum bowing portion of the filling film 23. Thereafter, a metal film 27 is formed by deposition of a metal such as nickel (Ni) or cobalt (Co) within the slit ST, and reaction with the silicon of the word line WL is caused to form a silicide (not shown).

Figure 23:
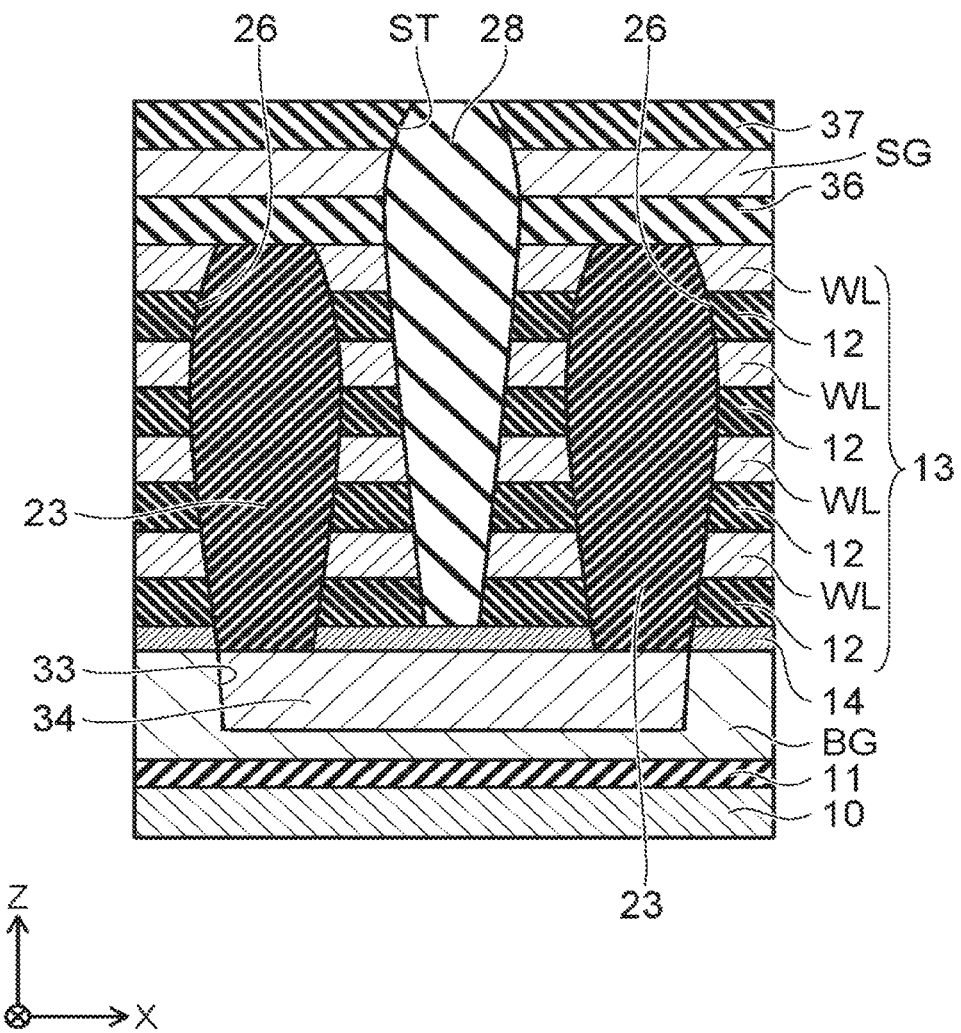

Then, as shown in FIG. 23, an unreacted part of the metal film 27 is removed. Thereafter, the insulating member 28 is formed by embedding an insulating material into the slit ST.

Figure 24:
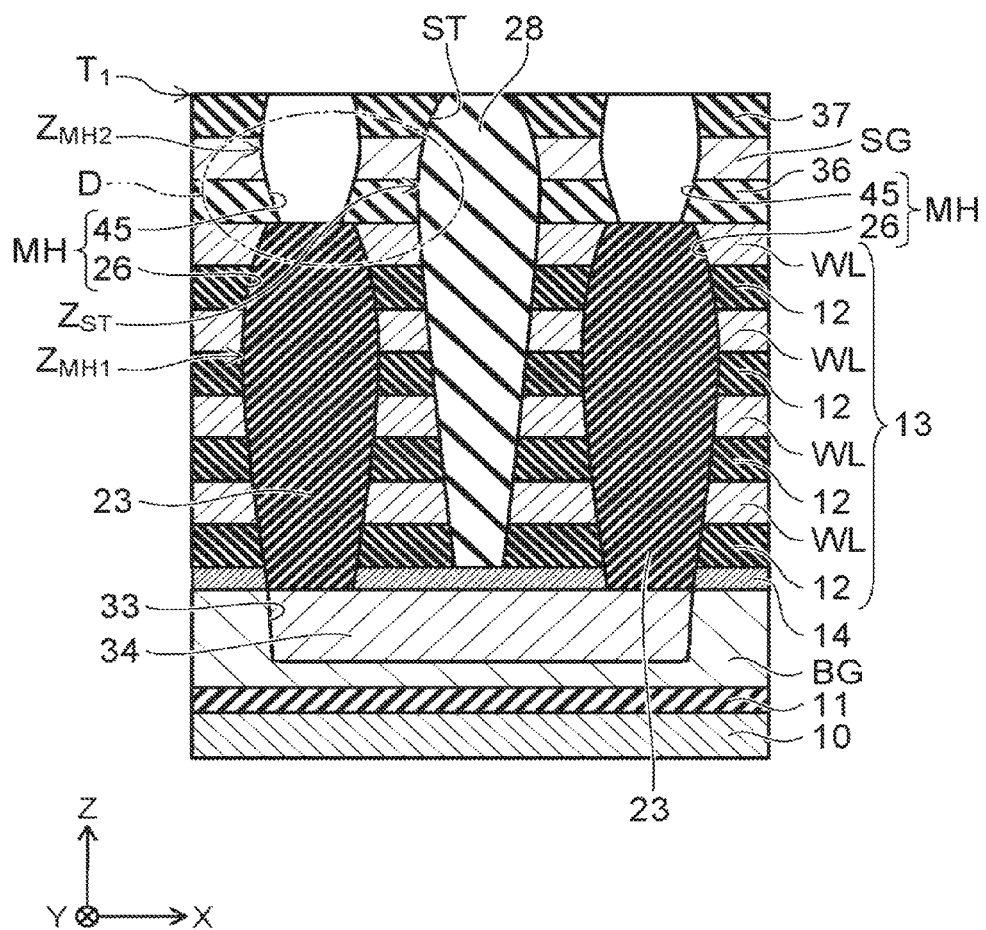

Then, as shown in FIG. 24, the range of formation of the upper portion 45 of the memory hole MH is identified by lithography, the stacked body is selectively removed from the interlayer insulating film 37 to the interlayer insulating film 36 by performing etching, and thus the upper portion 45 of the memory hole MH penetrating this stacked body in the Z-direction is formed. The center line of the upper portion 45 of the memory hole MH is aligned with the center line of the lower portion 26 of the memory hole MH. At this time, the cross-sectional shape of the upper portion 45 of the memory hole MH also becomes a bowing shape because of a high aspect ratio. Then, the position of the upper end of the insulating member 28 and the position of the upper end of the upper portion 45 of the memory hole MH are located in the position $T_1$ of the same height. However, since their lengths are different from each other, as indicated by a part D in FIG. 24, the position $Z_{ST}$ of the maximum bowing portion of the insulating member 28 and the position $Z_{MH2}$ of the maximum bowing portion of the upper portion 45 of the memory hole MH can be displaced in the Z-direction. Furthermore, since the length of the upper portion 45 in the Z-direction is shorter than the length of the lower portion 26 and the length of the memory hole MH, the width of the maximum bowing portion $Z_{MH2}$ of the upper portion 45 is less than that of the lower portion 26 and the memory hole MH.

Figure 25:
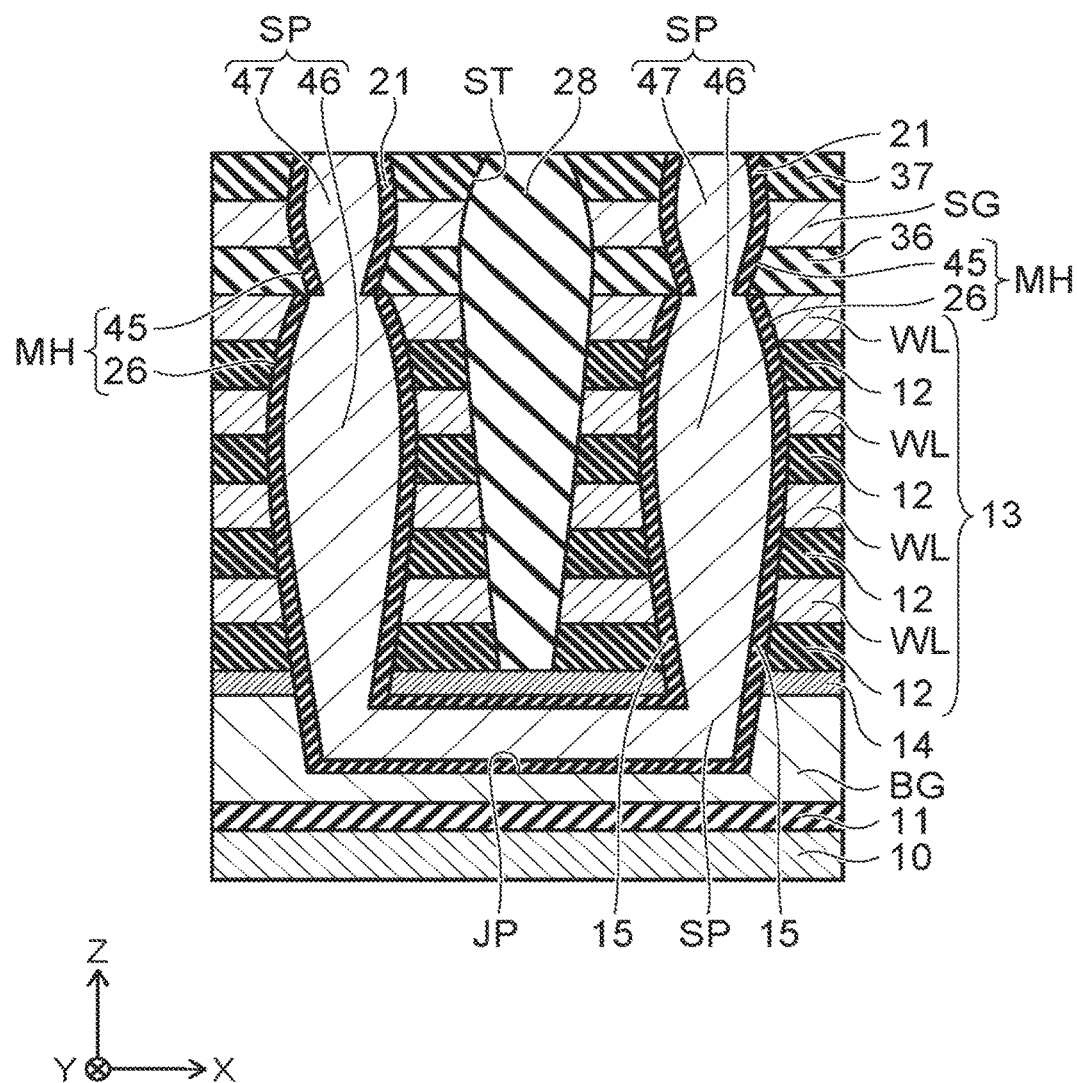

Subsequently, as shown in FIG. 25, the filling film 23 and the sacrificial film 34 are removed by performing etching on the filling film 23 within the lower portion 26 of the memory hole MH and the sacrificial film 34. The groove 33 formed within the back gate electrode BG emerges by the removal of the sacrificial film 34. The groove 33 that emerges is referred to as the joint portion JP. Thereafter, a block insulating film, a charge film and a tunnel insulating film are formed in this order on the side surface of the memory hole MH formed of the lower portion 26 and the upper portion 45 and on the side surface of the joint portion JP and thus the memory film 21 is formed. After that, the silicon pillar SP is formed by embedding the pair of the memory holes MH and the joint portion JP by using, for example, silicon.

A method for forming the portions from the contact plug $CP_{SL}$ to the bit line BL is the same as in the first embodiment described above.

The manufacturing method other than what has been described above in the embodiment is the same as in the first embodiment described above.

Next, the effects of the embodiment will be described.

In the semiconductor memory device according to the embodiment, the position of the upper end of the insulating member 28 and the position of the upper end of the lower portion 46 of the silicon pillar SP are made to differ from each other, and thus the position of the maximum bowing portion $Z_{ST}$ of the insulating member 28 and the position of the maximum bowing portion $Z_{MH1}$ of the lower portion 46 can be displaced in the Z-direction. In addition, the position of the upper end of the insulating member 28 and the position of the upper end of the upper portion 47 are located at the same height, but since their lengths are different from each other, the position of the maximum bowing portion $Z_{ST}$ of the insulating member 28 and the position of the maximum bowing portion $Z_{MH2}$ of the upper portion 47 can be displaced in the Z-direction. Furthermore, since the length of the upper portion 47 in the Z-direction is shorter than the length of the lower portion 46 and the length of the insulating member 28, the width of the maximum bowing portion $Z_{MH2}$ of the upper portion 47 is less than that of the lower portion 46 and the insulating member 28.

Consequently, the minimum distance between the insulating member 28 and the silicon pillar SP is increased, and thus it is possible to prevent the insulating member 28 and the silicon pillar SP from being excessively close to each other. Since the minimum cross-sectional area of the word line WL sandwiched between the insulating member 28 and the silicon pillar SP on the XZ plane can be secured so as to be not less than a prescribed value, it is possible to lower the wiring resistance of the word line WL.

Although in the embodiment, the example has been described in which the lower portion 26 of the memory hole MH is formed, then the slit ST is formed and thereafter the upper portion 45 of the memory hole MH is formed, there is no restriction on this example. There may be adopted a configuration in which the upper portion 45 of the memory hole MH is formed after formation of the lower portion 26 of memory hole MH and then, the slit ST is formed.

After the memory hole MH is formed separately by using not less than three processes, the memory film 21 is formed on the side surface of the memory hole MH and on the side surface of the joint portion JP. After that, a pair of the memory holes MH and the joint portion JP are embedded using, for example, silicon and thus the silicon pillar SP is formed.

Variation of the Second Embodiment

Next, a variation of the second embodiment will be described.

Figure 26:
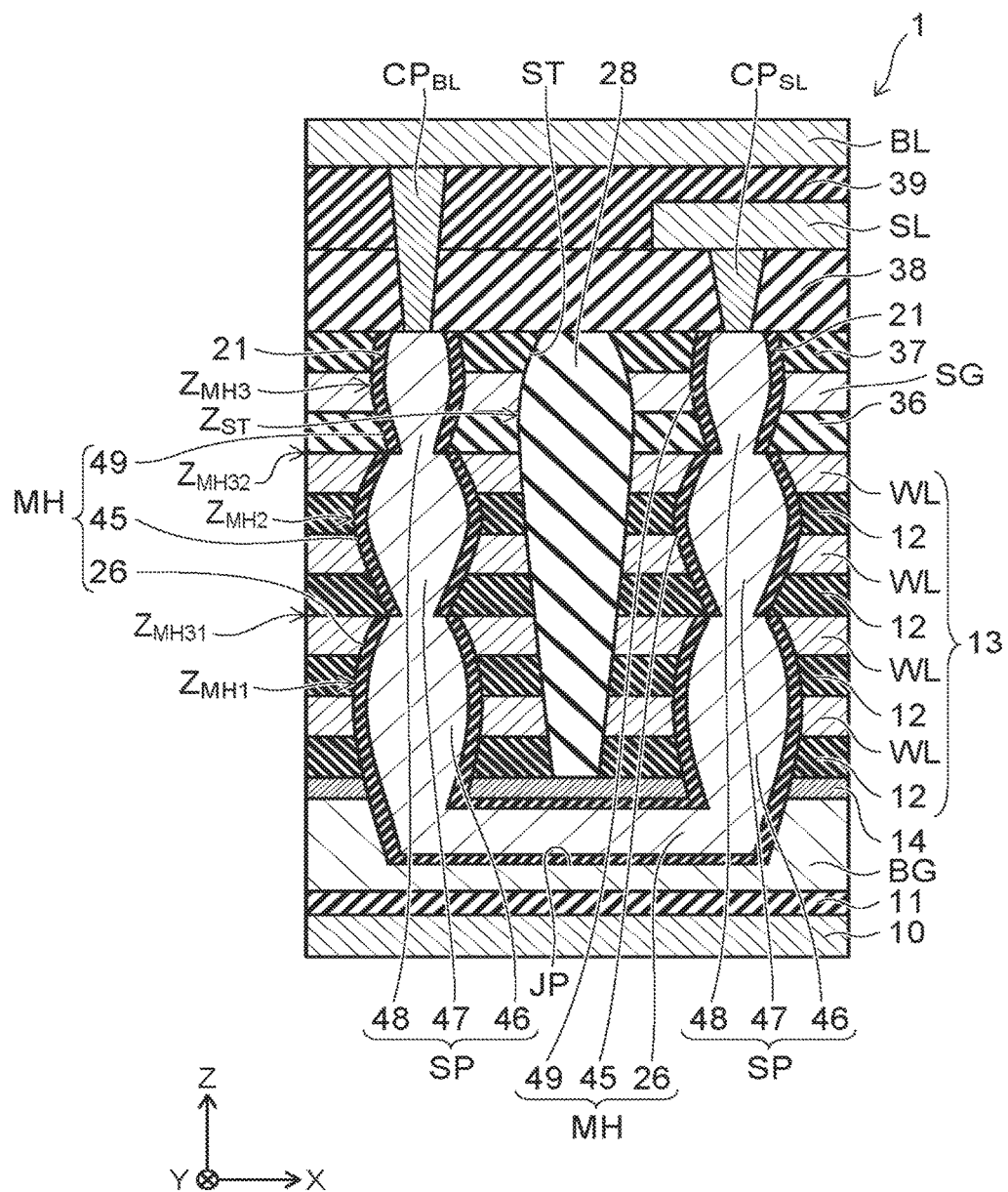
FIG. 26 is a cross-sectional view illustrating a semiconductor memory device according to a variation of the second embodiment.

FIG. 26 is a cross-sectional view illustrating a semiconductor memory device according to the variation.

As shown in FIG. 26, in the semiconductor memory device 1 in a case of separately forming the memory hole MH by using, for example, three processes, the position of the maximum bowing portion $Z_{ST}$ of the insulating member 28 is provided to be higher than the position of the maximum bowing portion $Z_{MH2}$ of the silicon pillar SP, in the Z-direction. There are two points $Z_{MH31}$ and $Z_{MH32}$, as the minimum point where the distance from the side wall of the silicon pillar SP to the center line becomes minimum as shown in FIG. 26.

The configurations, the manufacturing method and the effects other than what has been described above in the variation are the same as in the second embodiment described above.

In the embodiments described above, it is possible to prevent the silicon pillar and the insulating member from being excessively close to each other and to provide a semiconductor memory device in which the wiring resistance of the word line WL is low and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
  a stacked body including an insulating film and an electrode film alternately stacked;
  an insulating member provided in the stacked body, the insulating member extending in a stacking direction of the stacked body, and in a first direction crossing the stacking direction, the insulating member including a first portion located between a top end portion of the insulating member and a bottom end portion of the insulating member in the stacking direction, a width of the first portion along a second direction being greater than a width of the top end portion along the second direction and a width of the bottom end portion along the second direction, the second direction crossing the stacking direction and the first direction; and
  a semiconductor pillar provided in the stacked body and extending in the stacking direction, the semiconductor pillar including a second portion located between a top end portion of the semiconductor pillar and a bottom end portion of the semiconductor pillar in the stacking direction, a diameter of the second portion along a plane parallel with the first direction and the second direction being greater than a diameter of the top end portion of the semiconductor pillar along the plane, the first portion and the second portion being located in different positions in the stacking direction.

2. The device according to claim 1, further comprising a substrate,
the substrate and the stacked body being arranged in the stacking direction, and
a distance between the substrate and the first portion being longer than a distance between the substrate and the second portion.

3. The device according to claim 1, further comprising a substrate,
the substrate and the stacked body being arranged in the stacking direction, and
the stacked body being disposed above the substrate, and
a distance between the substrate and the first portion being shorter than a distance between the substrate and the second portion.

4. The device according to claim 1, wherein
the insulating member further includes a third portion and a fourth portion, the third portion is located between the first portion and the fourth portion in the stacking direction,
a width of the third portion along the second direction is smaller than the width of the first portion along the second direction and a width of the fourth portion along the second direction,
the width of the fourth portion is greater than the width of the top end portion of the insulating member and the width of the bottom end portion the insulating member,
the fourth portion and the second portion are located in different positions in the stacking direction.

5. The device according to claim 1, wherein
the semiconductor pillar further includes a third portion and a fourth portion, the third portion is located between the second portion and the fourth portion in the stacking direction,
a diameter of the third portion along the plane is smaller than the diameter of the second portion and a diameter of the fourth portion along the plane,
the diameter of the fourth portion is greater than the diameter of the top end portion of the semiconductor pillar along the plane,
the fourth portion and the first portion are located in different positions in the stacking direction.

6. A semiconductor memory device comprising:
a stacked body including an insulating film and an electrode film alternately stacked;
an insulating member provided in the stacked body, the insulating member extending in a stacking direction of the stacked body, and in a first direction crossing the stacking direction, the insulating member including a first portion located between a top end portion of the insulating member and a bottom end portion of the insulating member in the stacking direction, a width of the first portion along a second direction being greater than a width of the top end portion along the second direction and a width of the bottom end portion along the second direction, the second direction crossing the stacking direction and the first direction; and
a semiconductor pillar provided in the stacked body and extending in the stacking direction, the semiconductor pillar including a second portion, a third portion, and a fourth portion, the second portion, the third portion, and the fourth portion being located between a top end portion of the semiconductor pillar and a bottom end portion of the semiconductor pillar in the stacking direction, the third portion being disposed between the second portion and the fourth portion, a diameter of the second portion along a plane parallel with the first direction and the second direction and a diameter of the fourth portion along the plane being greater than a diameter of the top end portion of the semiconductor pillar along the plane and a diameter of the third portion along the plane, a position of the first portion being different from a position of the second portion and a position of the fourth portion in the stacking direction.

7. The device according to claim 6, further comprising a substrate,
the substrate and the stacked body being arranged in the stacking direction, and
a distance between the substrate and the first portion being longer than a distance between the substrate and the second portion, the distance between the substrate and the second portion being longer than a distance between the substrate and the fourth portion.

* * * * *